(12) United States Patent
Lin et al.

(10) Patent No.: US 11,424,339 B2
(45) Date of Patent: Aug. 23, 2022

(54) INTEGRATED CHIP AND METHOD OF FORMING THEREOF

(71) Applicant: TAIWAN SEMICONDUCTOR MANUFACTURING CO., LTD., Hsinchu (TW)

(72) Inventors: Meng-Han Lin, Hsinchu (TW); Chia-En Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/081,012

(22) Filed: Oct. 27, 2020

(65) Prior Publication Data

US 2022/0130975 A1    Apr. 28, 2022

(51) Int. Cl.
*H01L 29/49* (2006.01)
*H01L 29/78* (2006.01)
*H01L 29/66* (2006.01)
*H01L 29/08* (2006.01)
*H01L 21/3215* (2006.01)
*H01L 21/762* (2006.01)
*H01L 29/06* (2006.01)

(52) U.S. Cl.
CPC .... *H01L 29/4916* (2013.01); *H01L 21/32155* (2013.01); *H01L 21/76232* (2013.01); *H01L 29/0653* (2013.01); *H01L 29/0847* (2013.01); *H01L 29/66795* (2013.01); *H01L 29/7853* (2013.01)

(58) Field of Classification Search
CPC ................ H01L 29/4916; H01L 21/76232
See application file for complete search history.

(56) References Cited

U.S. PATENT DOCUMENTS 6,015,993 A  *  1/2000  Voldman ............. H01L 29/7391
                                                           257/355
2019/0148375 A1*  5/2019  Lin ................... H01L 29/42376
                                                           257/394

* cited by examiner

*Primary Examiner* — Changhyun Yi
(74) *Attorney, Agent, or Firm* — Birch, Stewart, Kolasch & Birch, LLP

(57) ABSTRACT

An integrated chip includes a substrate, an isolation structure and a poly gate structure. The isolation structure includes dielectric materials within the substrate and having sidewalls defining an active region. The active region has a channel region, a source region, and a drain region separated from the source region by the channel region along a first direction. The source region has a first width along a second direction perpendicular to the first direction, the drain region has a second width along the second direction, and the channel region has a third width along the second direction and larger than the first and second widths. The poly gate structure extends over the channel region. The poly gate structure includes a first doped region having a first type of dopants and a second doped region having a second type of dopants. The second type is different from the first type.

20 Claims, 35 Drawing Sheets

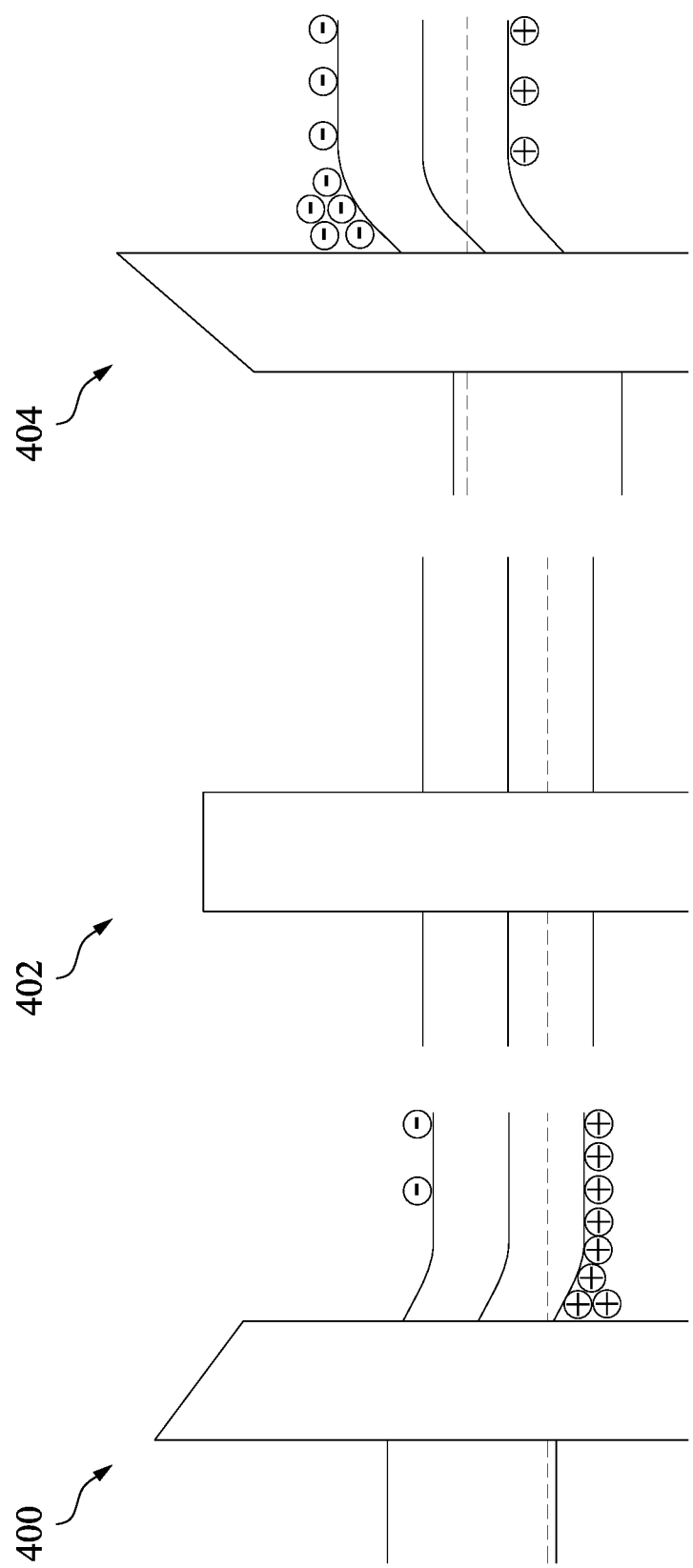

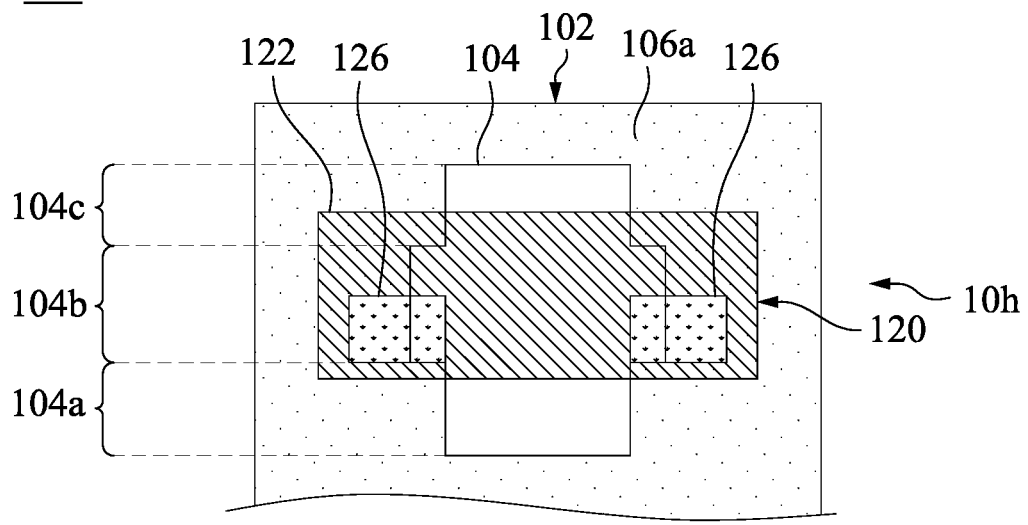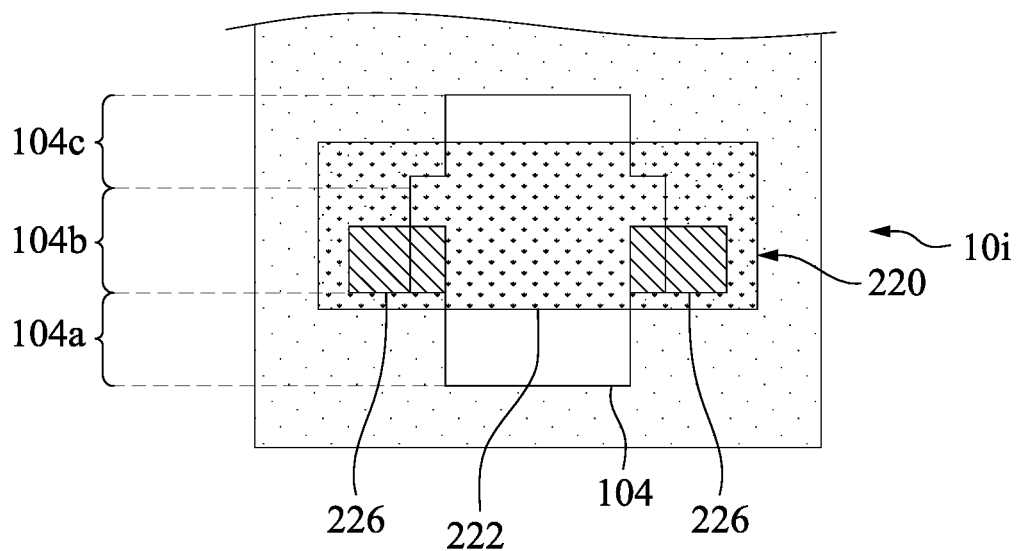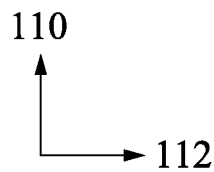
Fig. 14F

INTEGRATED CHIP AND METHOD OF FORMING THEREOF

BACKGROUND

Modern day integrated chips comprise millions or billions of semiconductor devices formed on a semiconductor substrate (e.g., a silicon substrate). To improve functionality of integrated chips, the semiconductor industry has continually reduced the dimension of semiconductor devices to provide for integrated chips with small, densely populated devices. By forming integrated chips having small and densely populated devices, the speed of the devices increases and the power consumption of devices decreases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 shows an energy band diagram of interfaces of the p-type well with different structures.

FIGS. 14A-14F illustrate top views showing some alternative embodiments of integrated chips.

DETAILED DESCRIPTION

Figure 1A:
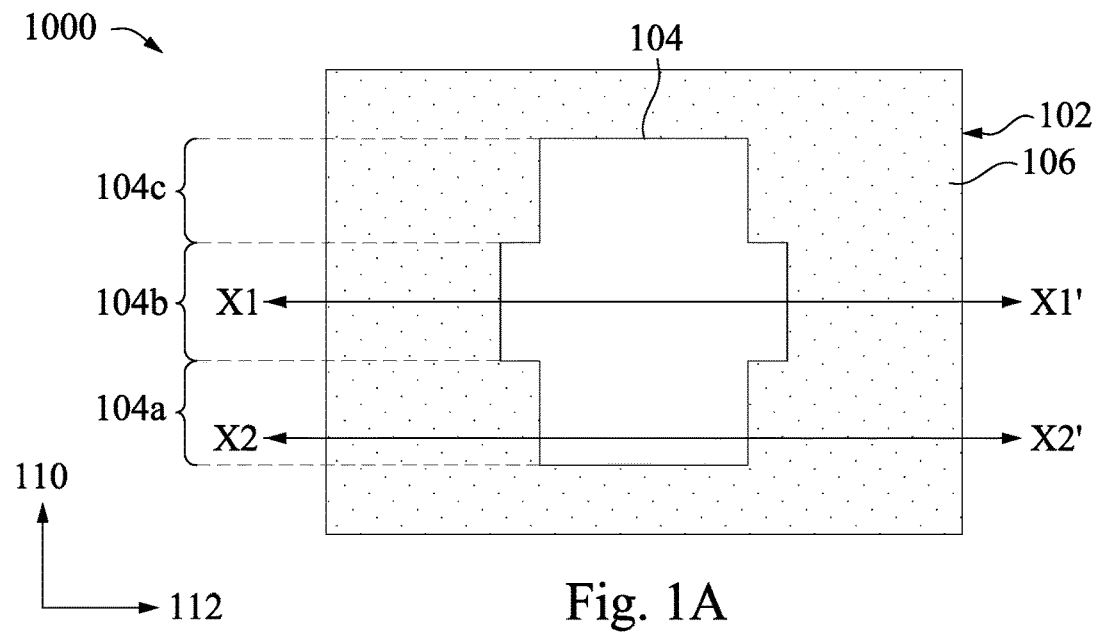
FIGS. 1A, 2A, 3A, 4A and 5A illustrate top views of illustrate intermediate stages in the formation of an integrated chip having a transistor device comprising a gate structure configured to improved device performance.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain embodiments, the term "about" used in this context means greater or less than the stated value or the stated range of values by a percentage such as 5%, 10%, 15%, etc. of the stated values.

In integrated chips, active devices (e.g., MOSFET (metal-oxide-semiconductor field effect transistor) devices, embedded memory devices, etc) are generally arranged on a shared semiconductor substrate (e.g., a silicon substrate). However, semiconductor materials can electrically conductive, such that leakage currents may travel between active devices that are located within a semiconductor substrate in close proximity to one another. If such leakage currents are not properly mitigated, cross-talk between adjacent devices can lead to integrated chip failure.

To prevent leakage currents from traveling between adjacent devices, many modern day integrated chips use shallow trench isolation (STI) structures. STI structures are formed by forming a pad oxide over a substrate, patterning the pad oxide according to a nitride masking layer, etching trenches in the substrate according to the nitride masking layer, filling the trenches with one or more dielectric materials (such as silicon dioxide or silicon nitride), and removing excess of the one of more dielectric materials from over the substrate. STI formation processes may furthermore use a wet etching process to remove the nitride masking layer and/or the pad oxide used during formation of the STI structures.

However, it has been appreciated that during the formation of an STI structure, divots may form within an upper surface of the STI structure (e.g., due to the wet etching process used to remove the nitride masking layer and/or pad oxide). Such divots can negatively impact electrical behavior (e.g., both threshold and sub-threshold voltages) of the devices, leading to unpredictable performance of the devices. For example, during fabrication of a transistor device, a conductive gate material can fill divots within an STI structure, causing the conductive gate material to have sharp edges that can enhance an electric field generated by a gate structure during operation of a transistor device. The enhanced electric field reduces a threshold voltage of the transistor device. The reduced threshold voltage may lead to turning on the transistor at an early time and a worse double hump effect, which is disadvantageous for exactly amplifying signal. For example, the amplified signal of the device may be non-uniform.

The present disclosure, in some embodiments, relates to a transistor device having a gate structure comprising multiple poly gate electrode regions having different types of dopants and being disposed within an active area having a shape configured to reduce a susceptibility of the transistor device to the performance degradation (e.g., the double hump effect) caused by divots in an adjacent isolation structure, and associated method of formation. The transistor device includes a substrate having interior surfaces defining a trench within an upper surface of the substrate. One or more dielectric materials are arranged within the trench. The one or more dielectric materials define an active region in the substrate. The active region has a source region, a drain region and a channel region between the source and drain regions. The source region and the drain region have widths that are smaller than the channel region. A gate structure extends over the active region at a location between the source and the drain regions. Because the source region and the drain region have smaller widths than the channel region, a resulting effective channel region extending between the source and drain regions will be separated from edges of the isolation structure by a distance. Separating the effective channel region from the edges of the isolation structure by the distance reduces an effect that divots within the isolation structure on the effective channel region. Moreover, the gate structure includes a first poly gate electrode region having a first type of dopants and a second poly gate electrode region having a second type of dopants different from the first type. The different types of dopants within the poly gate structure have different work functions that are able to be used to tune a threshold voltage of the transistor device to offset the undesirable effect of divots and/or dopant diffusion on the threshold voltage.

FIGS. 1A through 5C illustrate intermediate stages in the formation of an integrated chip having a transistor device comprising a gate structure configured to improved device performance. Each of the figure numbers in FIGS. 1A through 5C may include letters "A," "B," or "C," wherein letter "A" indicates that the respective figure illustrates a top view, and letters "B" and "C" indicate that the respective figure is obtained from the plane same as the vertical plane containing either line X1-X1' or X2-X2' in the corresponding top view, which will be discussed in detail in subsequent paragraphs. Although FIGS. 1A-5C are described with reference to a method, it will be appreciated that the structures shown in FIGS. 1A-5C are not limited to the method but rather may stand alone separate of the method.

Figure 1B:
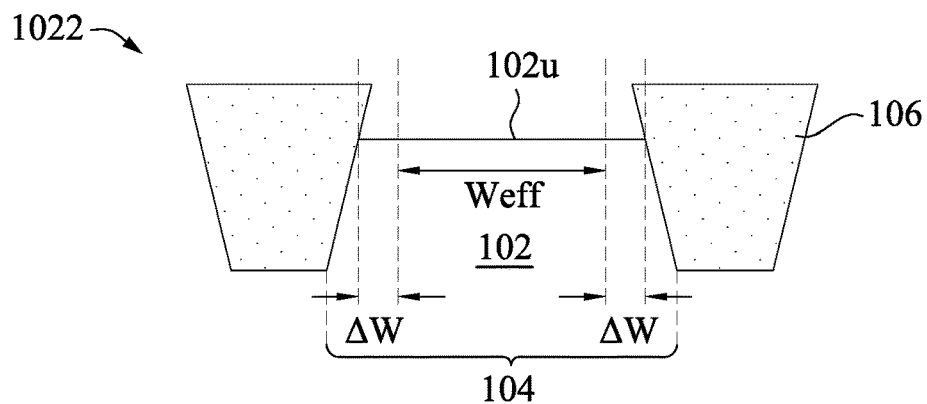
FIGS. 1B, 2B, 3B, 4B and 5B illustrate cross-sectional views of the integrated chip in FIGS. 1A, 2A, 3A, 4A and 5A, respectively, along the "X1-X1'" line thereof, in accordance with some embodiments.
Figure 1C:
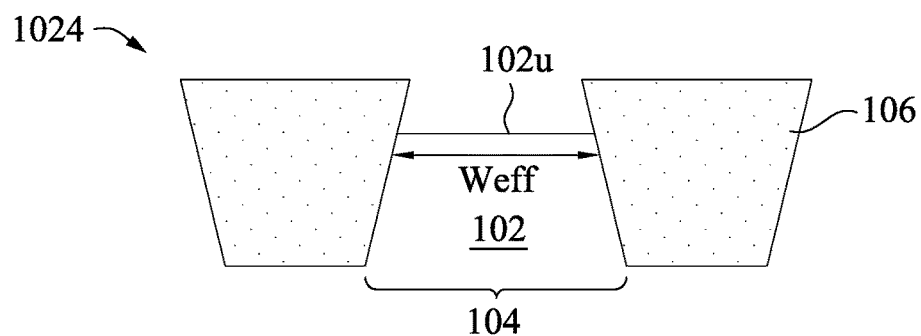
FIGS. 1C, 2C, 3C, 4C and 5C illustrate cross-sectional views of the integrated chip in FIGS. 1A, 2A, 3A, 4A and 5A, respectively, along the "X2-X2'" line thereof, in accordance with some embodiments.

As shown in top view 1000 of FIG. 1A, cross-sectional view 1022 of FIG. 1B and cross-sectional view 1024 of FIG. 1C, an active region 104 is defined within a substrate 102 corresponding to a transistor type (e.g., an NMOS transistor). In some embodiments, the active region 104 is equivalently referred to as an NMOS region. The active region 104 can be spaced apart from other active regions (not shown) by a dielectric material 106 can be referred to as an oxide definition (OD) region. The dielectric material 106 is formed within a trench within the substrate 102 defined by interior surfaces of the substrate 102. In various embodiments, the substrate 102 may be any type of semiconductor body (e.g., silicon, SiGe, SOI, etc.), as well as any other type of semiconductor, epitaxial, dielectric, or metal layers, associated therewith. In various embodiments, the one or more dielectric material 106 may comprise an oxide, a nitride, a carbide, or the like.

In some embodiments, the at least one p-type transistor using the active region 104 and the at least one n-type transistor using the active region 104 can be deployed in an inverter, a logic gate circuit, an amplifier, a charge pump circuit, or any circuit that has a complementary metal-oxide-semiconductor (CMOS) device.

The active region 104 exposes an upper surface 102u of the substrate 102. As shown in top view 1000 of FIG. 1A, the active region 104 has a source region 104a, a drain region 104c, and a channel region 104b. The channel region 104b is arranged between the source region 104a and the drain region 104c along a first direction 110. The source region 104a and the drain region 104c have smaller widths than the channel region 104b along a second direction 112 that is perpendicular to the first direction 110.

In some additional embodiments, the dielectric material 106 may be formed by using a thermal process to form a pad oxide over the substrate 102, followed by the formation of a nitride film over the pad oxide. The nitride film is subsequently patterned (e.g., using a photosensitive material, such as photoresist), and the pad oxide and substrate 102 are patterned according to the nitride film to form the trench within the substrate 102. The trench is then filled with one or more dielectric material 106.

Figure 2A:
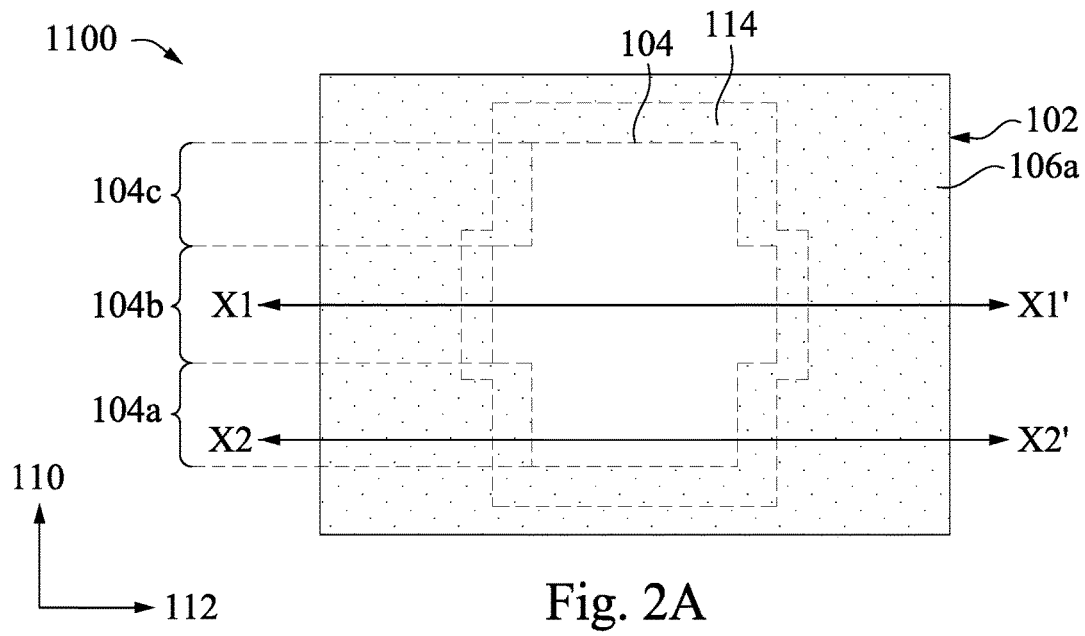
Figure 2B:
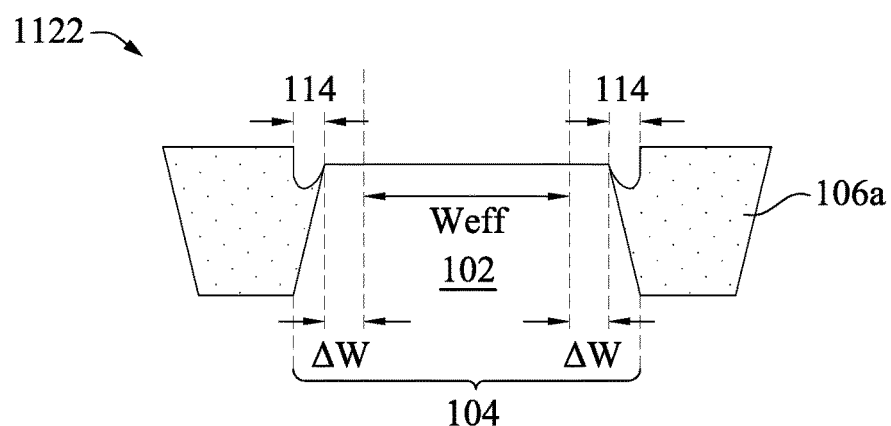
Figure 2C:
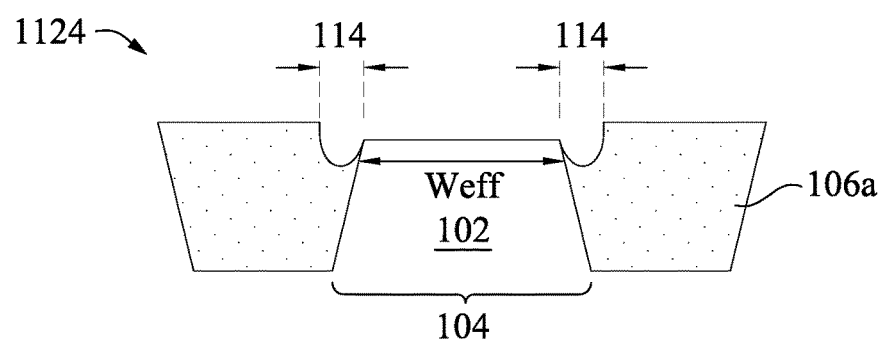

As shown in top view 1100 of FIG. 2A, cross-sectional view 1122 of FIG. 2B and cross-sectional view 1124 of FIG. 2C, after the trench is filled with the dielectric material 106, a multiple gate oxide (GOX) process is performed. For example, a top of the nitride film is exposed and the nitride film is removed. A planarization process (e.g., a chemical mechanical planarization (CMP) process) is performed to expose a top of the nitride film and an etch process to remove the nitride film and thus the isolation structure 106a is formed. The multiple GOX process may include (e.g., gate dielectric growth and gate dielectric removal), in which different gate dielectric layers are formed within different regions of the substrate 102. For example, in some embodiments, the multiple gate dielectric process may form a high voltage gate dielectric layer (e.g., by a thermal process) over a high voltage well within the substrate 102. The high voltage gate dielectric layer may be subsequently removed from one or more regions of a chip (e.g., within an embedded memory region), and a dual-gate dielectric layer may be formed over a logic well within the substrate 102 (e.g., by one or more deposition processes). It has been appreciated that the formation of multiple gate dielectric layers may lead to formation of the one or more divots 114 within the isolation structures 106a due to the additional etch processes that are performed to remove the gate dielectric layers from different regions of the substrate, thereby generating the double hump effect within associated transistor devices.

One or more divots 114 may be formed due to the multiple GOX process. The one or more divots 114 may be formed within the isolation structure 106a that are recessed below a top of the isolation structure 106a. That is, the isolation structure 106a has surfaces defining the one or more divots 114 recessed below an uppermost surface of the isolation structure 106a. The one or more divots 114 may be arranged along edges of the isolation structure 106aa that are proximate to the active region 104.

Since the widths of the source region 104a and the drain region 104c are less than the width of the channel region 106b, an effective channel region has an effective channel width Weff that is separated from the one or more divots 114 within the isolation structure 106a along the second direction 112 by a distance ΔW. Separating the effective channel width Weff of the effective channel region from the one or more divots 114 within the isolation structure 106a by the distance ΔW reduces an effect of the one or more divots 114 on the electric field generated by a subsequently formed gate structure along edges of the effective channel region 116. By reducing an effect of the one or more divots 114 on the effective channel region, a performance of the transistor device is improved (e.g., the double hump effect in the drain current caused by the effect of the one or more divots 114 on the electric field generated by the subsequently formed gate structure is reduced).

Figure 3A:
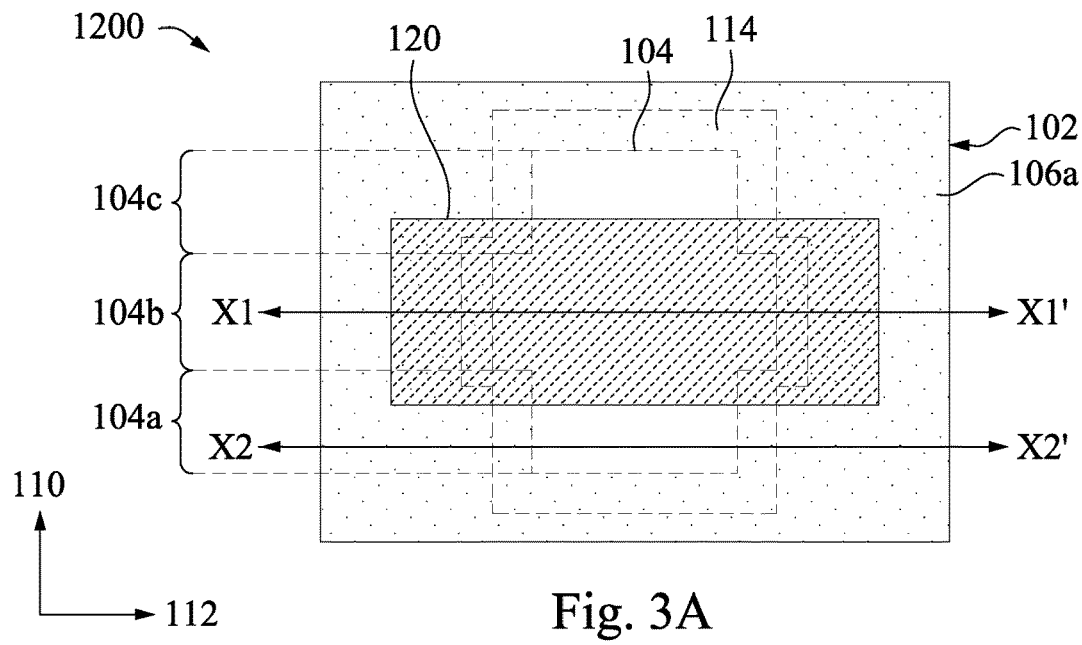
Figure 3B:
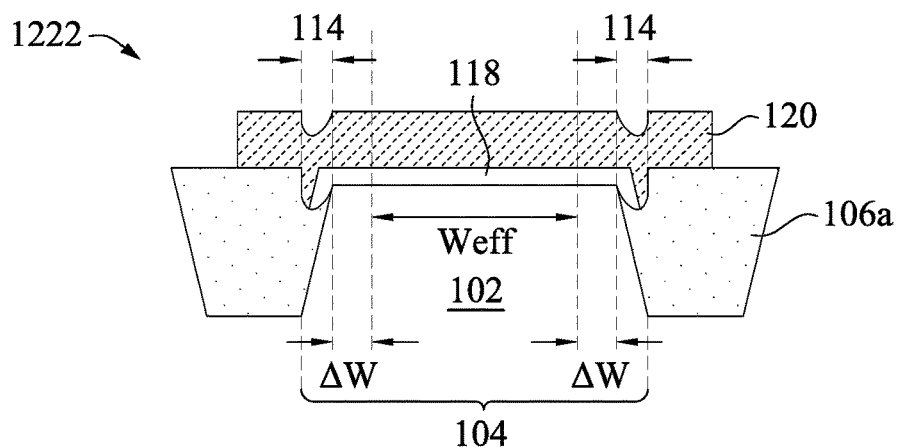
Figure 3C:
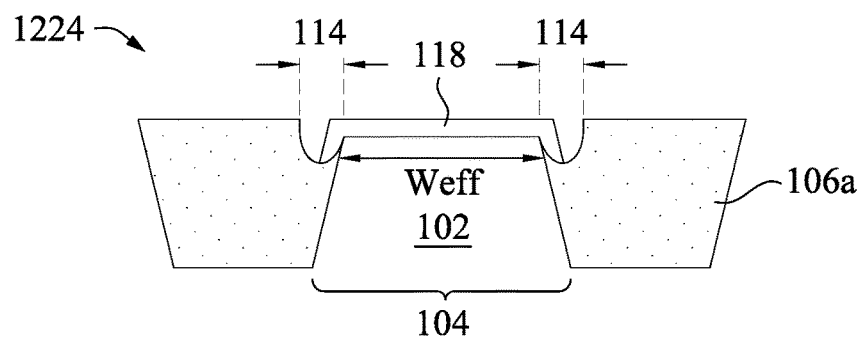

As shown in top view 1200 of FIG. 3A, cross-sectional view 1222 of FIG. 3B and cross-sectional view 1224 of FIG. 3C, a gate dielectric 118 is formed over the substrate 102 and within the active region 104 and a poly gate electrode 120 is formed over the gate dielectric 118 and within the divots 114 in the isolation structure 106a. The gate dielectric 118 is formed within the divots 114 in the isolation structure 106a. In some embodiments, the gate dielectric 118 may comprise an oxide (e.g., silicon oxide), a nitride (e.g., silicon oxynitride), a high κ gate dielectric layer (dielectric constant K greater than about 3.9), some other suitable dielectric(s), the like, or combinations thereof. In some embodiments, the gate dielectric 118 may be formed by way of a vapor deposition technique (e.g., physical vapor deposition (PVD), chemical vapor deposition (CVD), plasma-enhanced CVD (PE-CVD), atomic layer deposition (ALD), etc.). In other embodiments, the gate dielectric 118 may be formed by way of a thermal growth process. In some embodiments, an implantation process may be performed prior to the formation of the gate dielectric 118 to form a well region (not shown) in the substrate 102. In some such embodiments, a sacrificial dielectric layer (not shown) may be formed over the substrate 102 prior to the implantation process to regulate a depth of the well region. The sacrificial dielectric layer is subsequently removed prior to formation of the gate dielectric.

The poly gate electrode 120 may be formed by way of a deposition process (e.g., CVD, PE-CVD, PVD, or ALD). In some embodiments, the poly gate electrode 115 may comprise doped polysilicon or undoped polysilicon. The poly gate electrode 120 and the gate dielectric 118 may fill the one or more divots 114 within the upper surface of the isolation structure 106a.

The gate dielectric 118 and the poly gate electrode 120 may be selectively patterned according to a masking layer (not shown) formed over the poly gate electrode 120. In some embodiments, the masking layer may comprise a photosensitive material (e.g., photoresist) formed by a spin coating process. In such embodiments, the layer of photosensitive material is selectively exposed to electromagnetic radiation according to a photomask. The electromagnetic radiation modifies a solubility of exposed regions within the photosensitive material to define soluble regions. The photosensitive material is subsequently developed to define openings within the photosensitive material by removing the soluble regions. In other embodiments, the masking layer may comprise a hard mask layer (e.g., a silicon nitride layer, a silicon carbide layer, or the like).

Figure 4A:
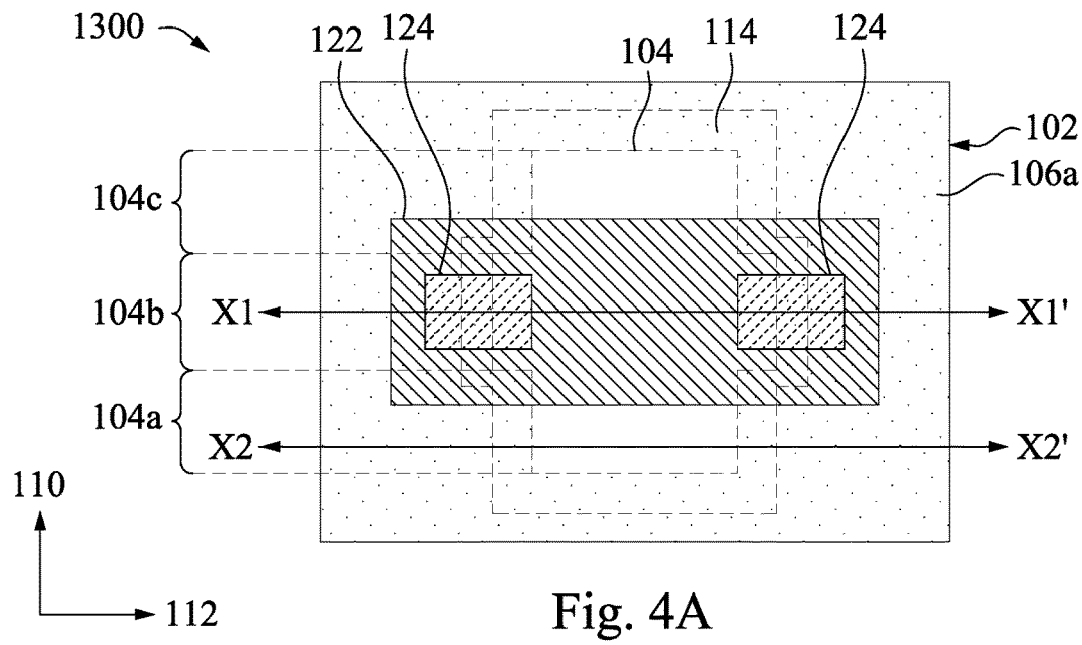
Figure 4B:
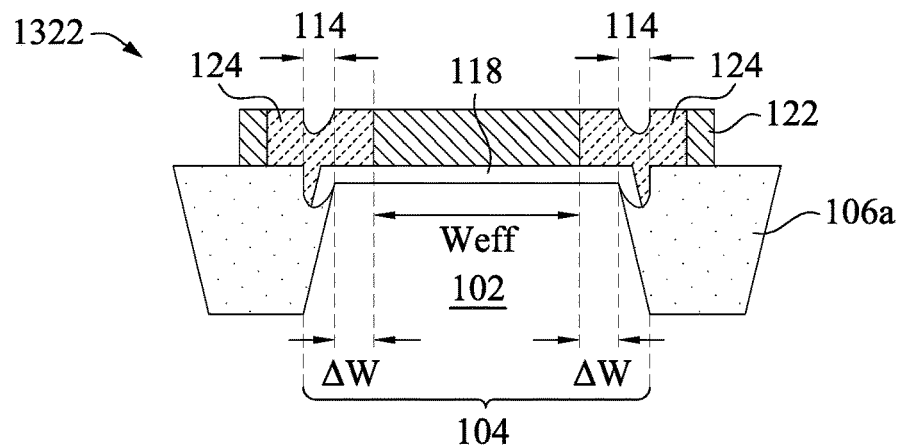
Figure 4C:
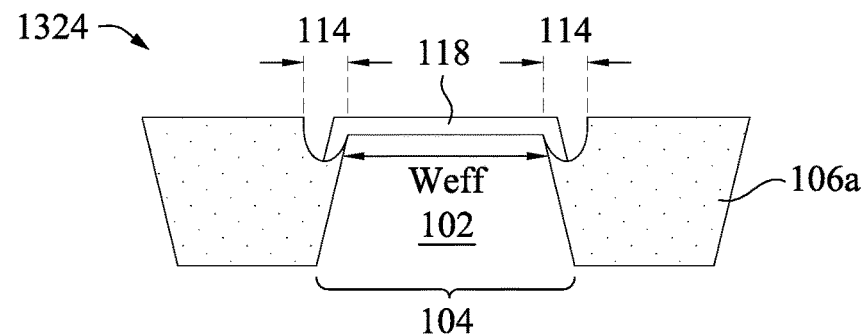

As shown in top view 1300 of FIG. 4A, cross-sectional view 1322 of FIG. 4B and cross-sectional view 1324 of FIG. 4C, a first doped region 122 is formed in the poly gate electrode 120. The first doped region 122 may be formed by implanting n-type or p-type dopants into the poly gate electrode 120 depending on the desired transistor device (e.g., NMOS or PMOS). For example, in some embodiments where the device is an NMOS, the first doped region 122 is implanted with n-type dopants. As illustrated in top view 1300 of FIG. 4A, the poly gate electrode 120 has non-doped regions 124 passing opposing sides of the channel region 104b remaining un-doped after forming the first doped region 122. The non-doped regions 124 are separate and distinct segments. For example, the non-doped regions 124 pass opposing sides of the divot 114 along the second direction 112. Stated differently, the non-doped regions 124 extend across the divot 114 along the second direction 112. In some embodiments, the first doped regions 122 have a dopant concentration in a range from about $1 \times 10^{13}$ cm$^{-2}$ to about $1 \times 10^{17}$ cm$^{-2}$. If the dopant concentration is lower than about $1 \times 10^{13}$ cm$^{-2}$, silicide (not shown) overlaying the poly gate electrode 120 may not be an ohmic contact and results in high contact resistance (Rc). If the dopant concentration is higher than about $1 \times 10^{17}$ cm$^{-2}$, such high dopant concentration might cause dopant re-distribution from the first doped region 122 through the gate dielectric 118 to the channel region 104b in subsequent high-temperature processes. Such phenomenon may lead to degradation of a quality of the gate dielectric 118 and affect the threshold voltage. In particular, this phenomenon usually occurs when the dopants include boron and is so-called boron penetration.

Figure 5A:
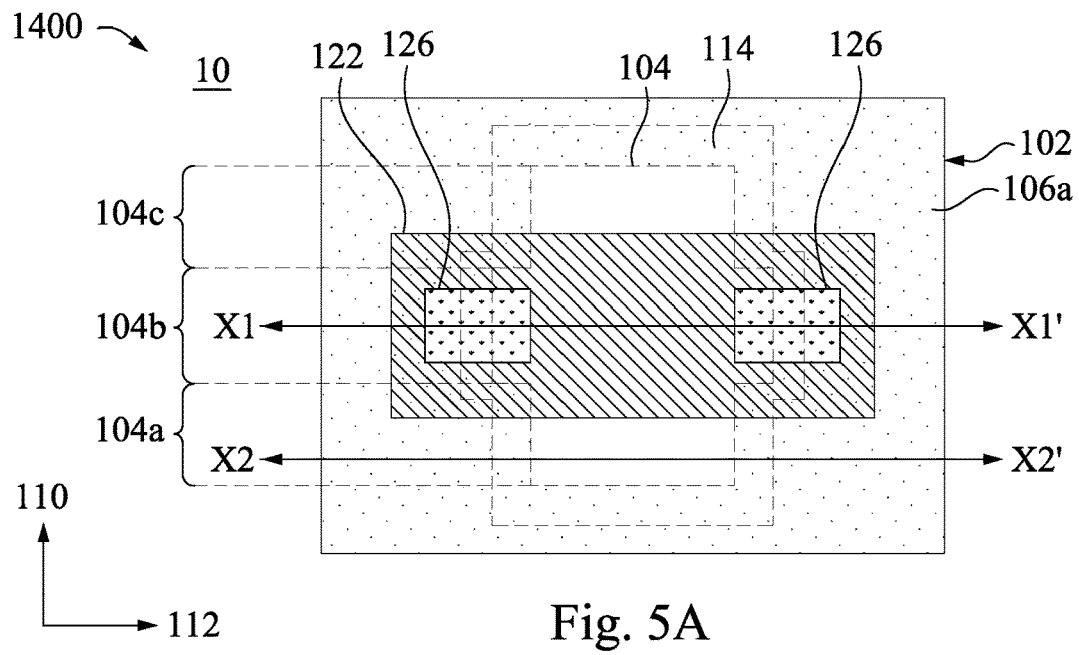
Figure 5B:
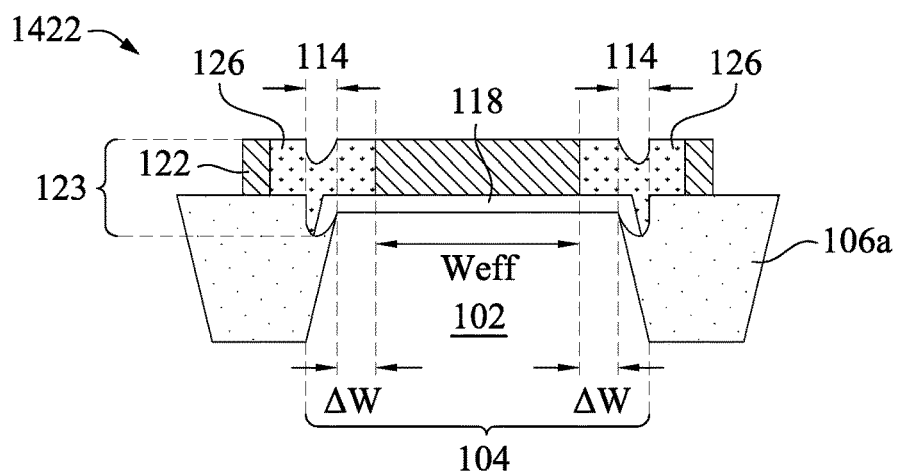
Figure 5C:
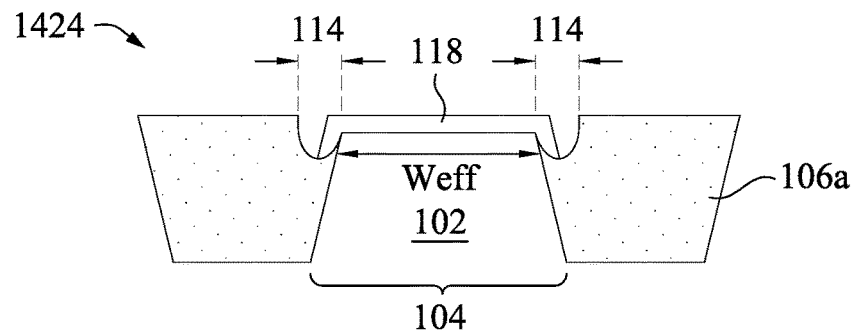

As shown in top view 1400 of FIG. 5A, cross-sectional view 1422 of FIG. 5B and cross-sectional view 1424 of FIG. 5C, the non-doped regions 124 are doped to form second doped regions 126 in the poly gate electrode 120. The first doped region 122, the second doped regions 126 and the gate dielectric 118 are in combination referred to as a gate structure 123. The second doped regions 126 may be formed by implanting n-type or p-type dopants into the poly gate electrode 120 depending on the desired transistor device (e.g., NMOS or PMOS). For example, in some embodiments where the device is an NMOS, the second doped regions 126 are implanted with p-type dopants. The second doped regions 126 are not arranged over the effective channel region. As mentioned above, as illustrated in top view 1400 of FIG. 4A, the second doped regions 126 pass opposing sides of the channel region 106b. The second doped regions 126 are separate and distinct segments. For example, the second doped regions 126 pass opposing sides of the divot 114 along the second direction 112. Stated differently, the second doped regions 126 extend across the divot 114 along the second direction 112. In some embodiments, the second doped regions 126 have a dopant concentration in a range from about $1 \times 10^{13}$ cm$^{-2}$ to about $1 \times 10^{17}$ cm$^{-2}$. If the dopant concentration is lower than about $1\times10^{13}$ cm$^{-2}$, it is difficult to increase the threshold voltage so that the double hump effect cannot be resolved. If the dopant concentration is higher than about $1\times10^{17}$ cm$^{-2}$, such high dopant concentration might cause dopant re-distribution from the second doped regions 126 through the gate dielectric 118 to the channel region 104b in subsequent high-temperature processes. Such phenomenon may lead to degradation of a quality of the gate dielectric 118 and affect the threshold voltage. In particular, this phenomenon usually occurs when the dopants include boron and is so-called boron penetration.

Figure 17C:
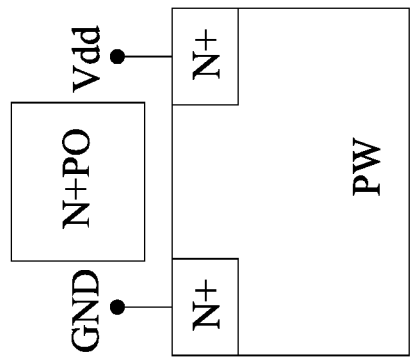
FIG. 17C illustrates a cross-sectional view of the integrated chip in FIG. 17A along the "X2-X2'" line thereof, in accordance with some embodiments.
Figure 17B:
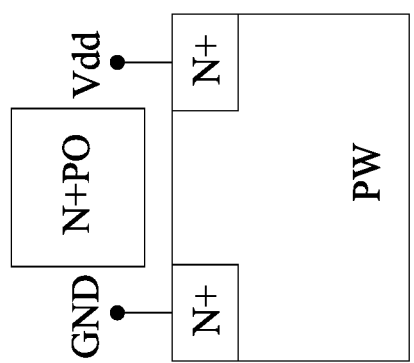
FIG. 17B illustrates a cross-sectional view of the integrated chip in FIG. 17A along the "X1-X1'" line thereof, in accordance with some embodiments.
Figure 17A:
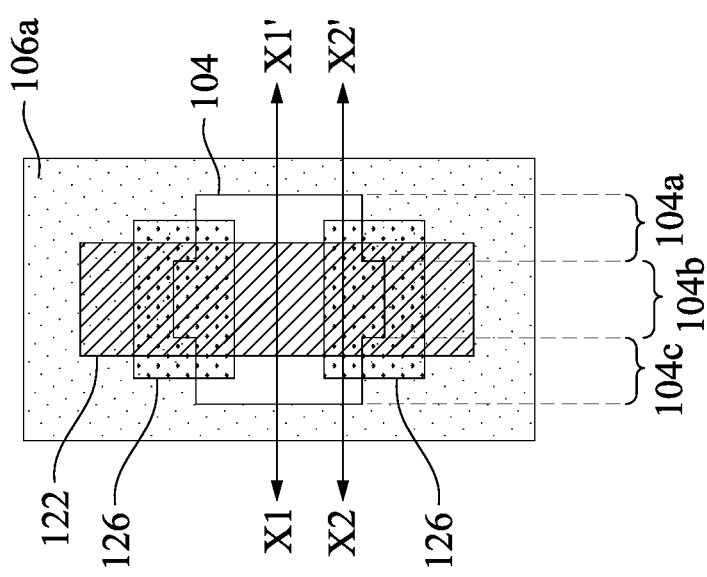
FIG. 17A illustrates a top view showing some alternative embodiments of integrated chip.

As shown in top view 1400 of FIG. 5A, the second doped regions 126 are enclosed by the first doped regions 122. In other words, the second doped regions 126 do not pass through sides of the first doped region 122. FIG. 17A illustrates a top view showing some alternative embodiments of integrated chip. FIG. 17B illustrates a cross-sectional view of the integrated chip in FIG. 17A along the "X1-X1'" line thereof, in accordance with some embodiments. FIG. 17C illustrates a cross-sectional view of the integrated chip in FIG. 17A along the "X2-X2'" line thereof, in accordance with some embodiments. As shown in FIGS. 17A-17C, the N+ source/drain regions are electrically connected to electrical ground (GND) and positive supply voltage (Vdd). The P+ source/drain regions are electrically connected to electrical ground (GND) and positive supply voltage (Vdd). If the second doped regions 126 pass sides of the first doped region 122, while the channel under the N+PO (n-type poly) gate can be controlled thereby, high off-state leakage may occur under the P+PO (p-type poly) gate.

Figure 6:
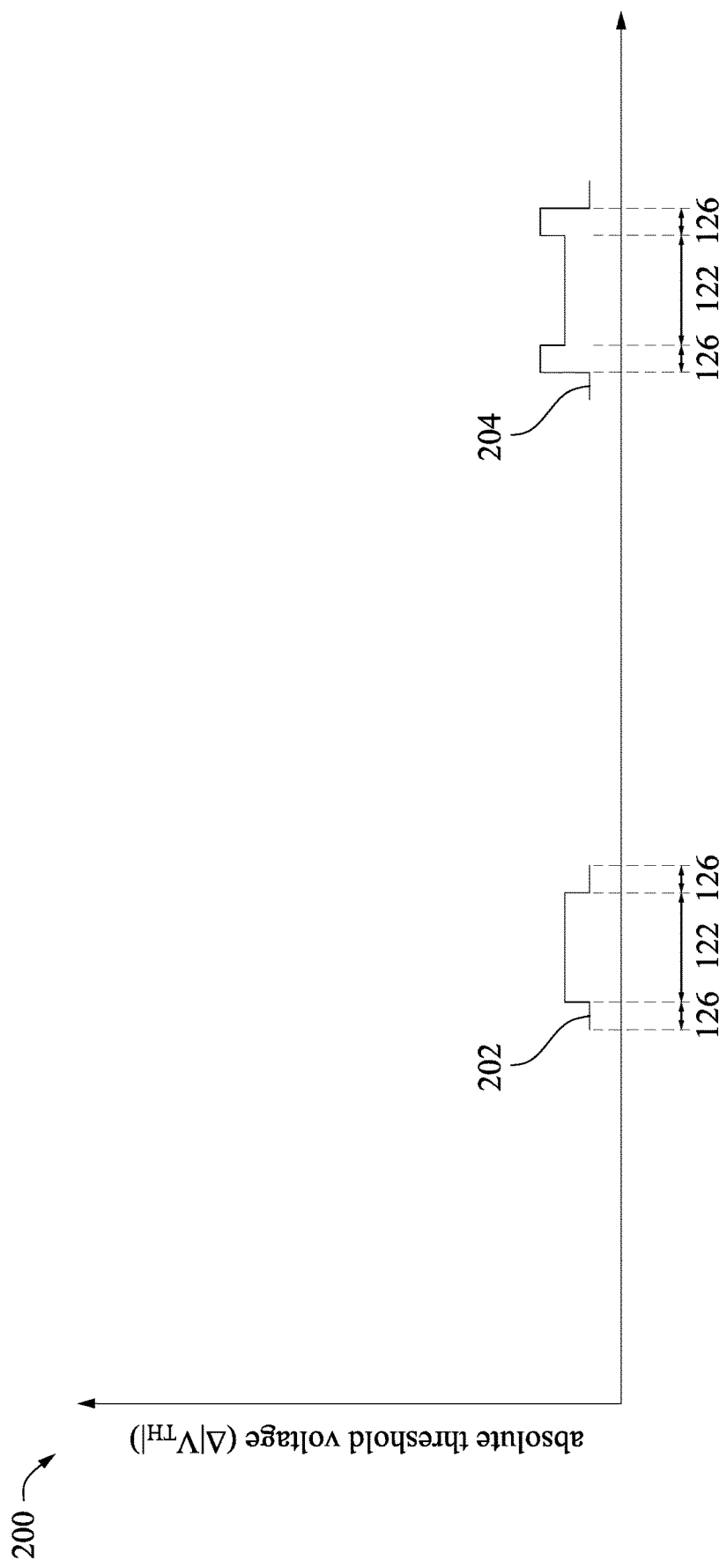
FIG. 6 illustrates a graph showing some embodiments of exemplary absolute threshold voltages (shown along the y-axis) as a function of a position within an active area (shown along x-axis) corresponding to the integrated chip of FIGS. 5A-5C.
Figures 7A, 7B:
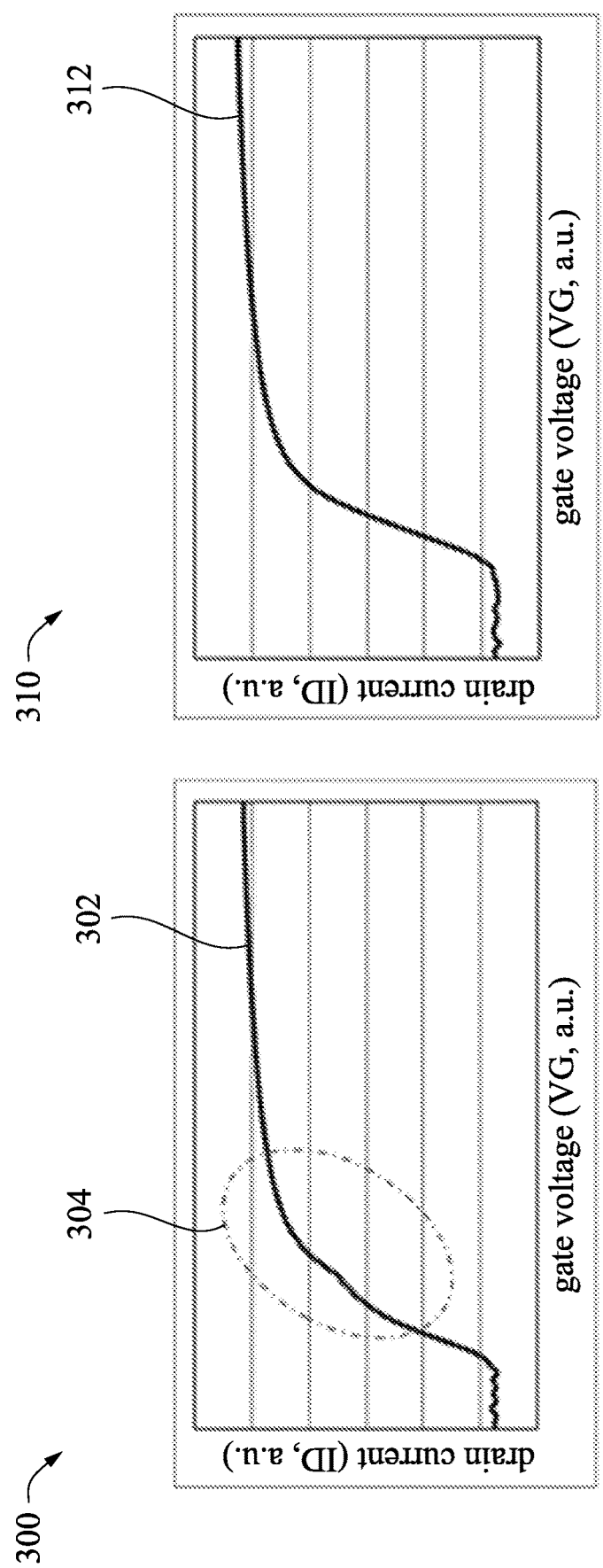
FIGS. 7A and 7B illustrate some embodiments of graphs, 208 and 212, showing examples of how different features of the integrated chip affect the drain current (shown along the y-axis) as a function of the gate voltage (shown along x-axis) of transistor.

Referring back to FIG. 6. FIG. 6 illustrates a graph 200 showing some embodiments of exemplary absolute threshold voltages (shown along the y-axis) as a function of a position within an active area (shown along x-axis) corresponding to the transistor device 10 of FIGS. 5A-5C. FIGS. 7A and 7B illustrate some embodiments of graphs, 300 and 310, showing examples of how different features of the integrated chip affect the drain current (shown along the y-axis) as a function of the gate voltage (shown along x-axis) of transistor device 10.

Line 202 of Graph 200 in FIG. 6 and graph 300 in FIG. 7A illustrate an example of an effect of divots and/or dopant (e.g., boron) diffusion on the absolute threshold voltage. As shown by line 302 of graph 300, due to the one or more divots within the isolation structure and/or low well concentration at oxide definition (0D)/shallow trench isolation (STI) interface) (e.g., dopant segregation in n-type MOSFET), an absolute threshold voltage is lower below the second doped region 126 than below the first doped region 122, thus resulting in the double hump effect (see line 302 of graph 300). The double hump of line 302 of graph 300 is marked by a dotted line 304.

Line 204 of Graph 200 in FIG. 6 and graph 310 in FIG. 7B illustrate an example of an effect of the different doped types of the first doped region 122 and the second doped region 126 on the absolute threshold voltage. As shown by line 204 of graph 200, due to the different doped types of the first doped region 122 and the second doped region 126, the poly gate structure 123 has a higher absolute threshold voltage below the second doped region 126 than below the first doped region 122. In some embodiments, a difference in the absolute threshold voltage $\Delta|V_{TH}|$ below the first doped region 122 and below the second doped region 126 is in a range of between approximately 0.5 V and approximately 1.5 V.

The higher absolute threshold voltage below the second doped region 126 (shown in line 204 of graph 200) offsets the decrease in absolute threshold voltage that is caused by the one or more divots and/or by the diffusion of dopants (shown in line 202 of graph 200) from the substrate into the isolation structure. By mitigating an effect of the one or more divots or by the diffusion of dopants from the substrate into the isolation structure, a performance of the transistor device is improved (e.g., the double hump effect in the drain current caused by the effect of the one or more divots on the electric field generated by the gate structure is reduced). As shown in FIG. 7B, line 312 of graph 310 is a smooth curve without double hump. In some embodiments where the transistor device 10 is configured to be an amplifier, the amplified signal of the transistor device 10 may be uniform. In particular, the transistor device 10 can be formed without an extra mask and thus enables low cost fabrication and the fabrication thereof is compatible to standard process. The transistor device 10 has no side effect on its reliability and performance as well.

FIG. 8 shows an energy band diagram of interfaces of the p-type well with different structures. Graph 400 is an energy band diagram of the p-type doped poly gate and p-type well interface. Graph 402 is an energy band diagram of a very lightly p-type doped gate and p-type well interface. Graph 404 is an energy band diagram of the n-type doped poly gate and p-type well interface. As shown in FIG. 8, the band in graph 400 is bent downward. It implies that energy is required to get an electron to go up and get a hole to go down in the graph 400. That is, high gate voltage is required to switch the channel from accumulation to inversion. By contrast, band in graph 402 and band in graph 404 are flat and bent upward, respectively.

Figure 9A:
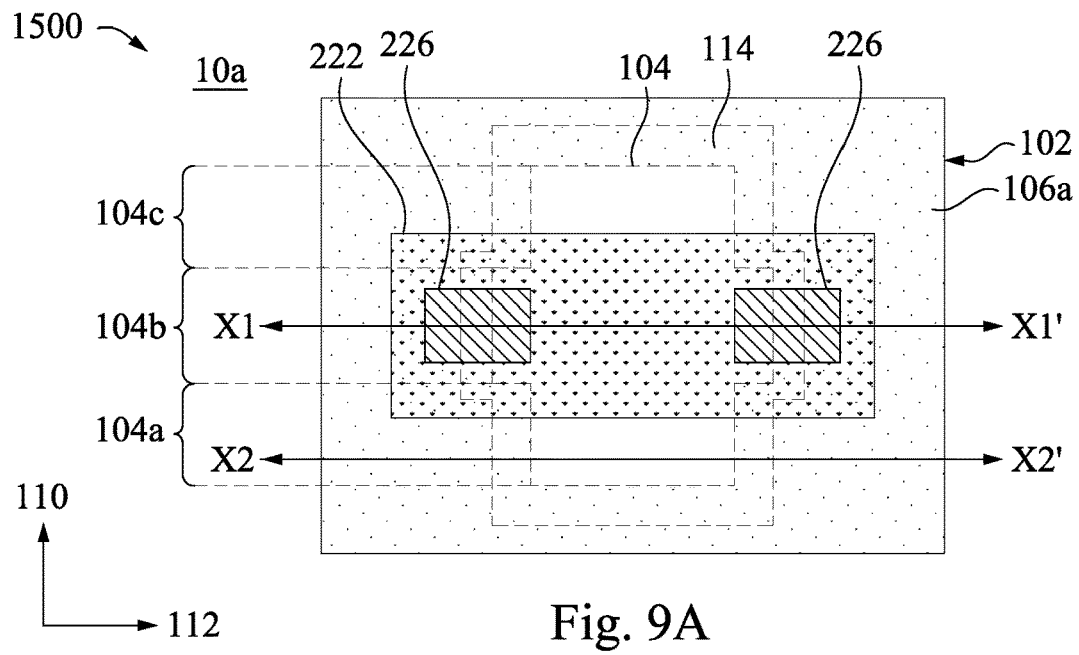
FIG. 9A illustrates a top view showing some alternative embodiments of integrated chip.
Figure 9B:
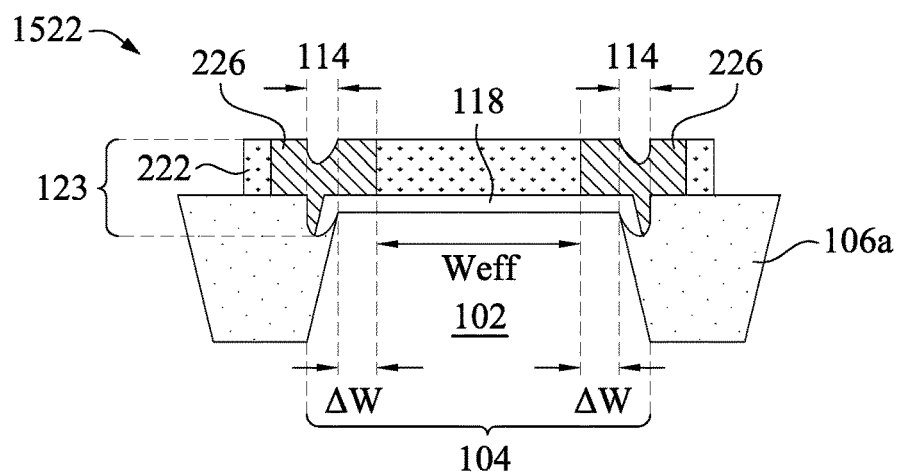
FIG. 9B illustrates a cross-sectional view of the integrated chip in FIG. 9A along the "X1-X1'" line thereof, in accordance with some embodiments.
Figure 9C:
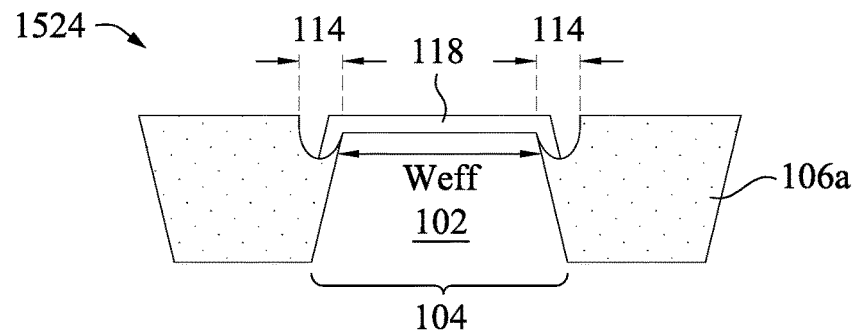
FIG. 9C illustrates a cross-sectional view of the integrated chip in FIG. 9A along the "X2-X2'" line thereof, in accordance with some embodiments.

FIGS. 9A, 9B and 9C show another transistor device 10a similar to the transistor device 10, except for the transistor device 10a is a PMOS device. As shown in top view 1500 of FIG. 9A, cross-sectional view 1522 of FIG. 9B and cross-sectional view 1524 of FIG. 9C, the first doped regions 222 may be formed by implanting p-type dopants into the poly gate electrode 120. The second doped regions 226 may be formed by implanting n-type dopants into the poly gate electrode 120. That is, the first doped regions 222 are implanted with p-type dopants. The second doped regions 226 are implanted with n-type dopants.

Figure 10A:
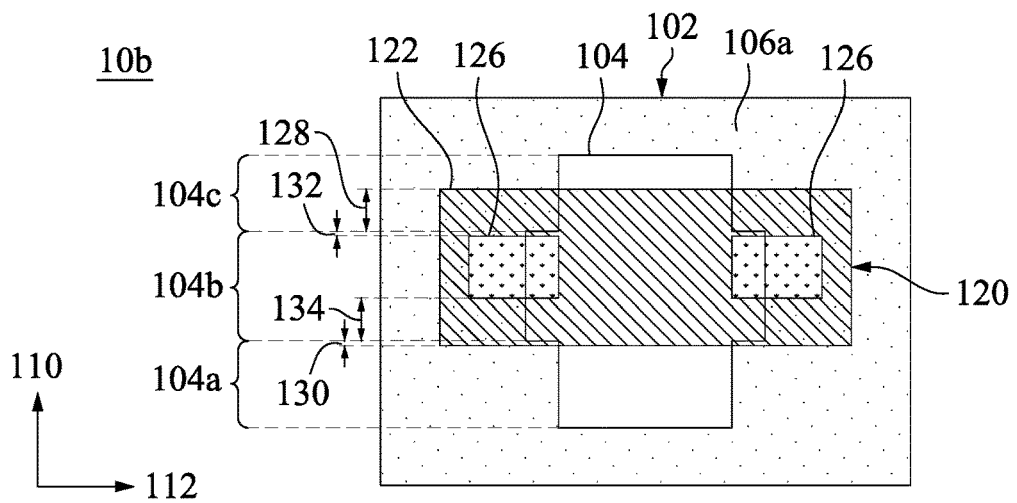
FIGS. 10A-10C illustrate top views showing some alternative embodiments of integrated chips.

FIG. 10A shows another transistor device 10b similar to the transistor device 10, except for positions of the first doped region 122 and the second doped regions 126 of poly gate electrode 120 being asymmetric with respect to the channel region 104b. For example, the first doped region 122 is set back from a boundary of the channel region 104b extending along the second direction 112 by a first distance 128 along the first direction 110 and set toward another boundary of the channel region 104b extending along the second direction 112 by a second distance 130 different from the first distance 128 along the first direction 110. In some embodiments, the first distance 128 is greater than the second distance 130. The second doped regions 126 are set toward a boundary of the channel region 104b extending along the second direction 112 by a third distance 132 along the first direction 110 and set back from another boundary of the channel region 104b extending along the second direction 112 by a fourth distance 134 different from the third distance 132 along the first direction 110. The third distance 132 is less than the fourth distance 134. In this embodiment, the second doped region 126 is symmetric with respect to a center of the poly gate electrode 120.

Figure 10B:
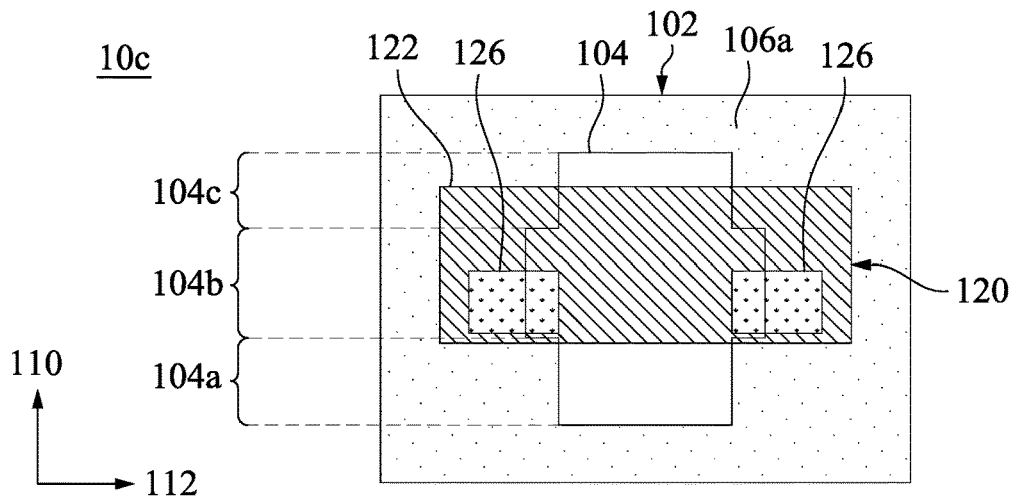

FIG. 10B shows another transistor device 10c similar to the transistor device 10b, except for the positions of the second doped regions 126 are asymmetric with respect to the center of the first doped region 122 of the poly gate electrode 120.

Figure 10C:
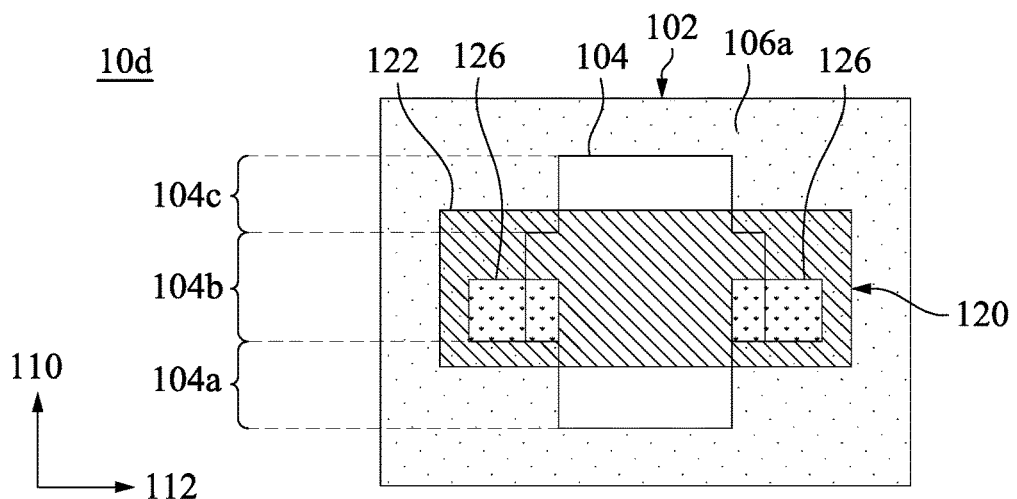

FIG. 10C shows another transistor device 10d similar to the transistor device 10c, except for the positions of the first doped region 122 and the second doped regions 126 of the poly gate electrode 120 being symmetric with respect to the channel region 104b and the boundary of the second doped regions 126 overlapping the boundary of the channel region 104b along the second direction 112. For example, the fourth distance 134 (see FIG. 10B) equals to zero.

Figure 11A:
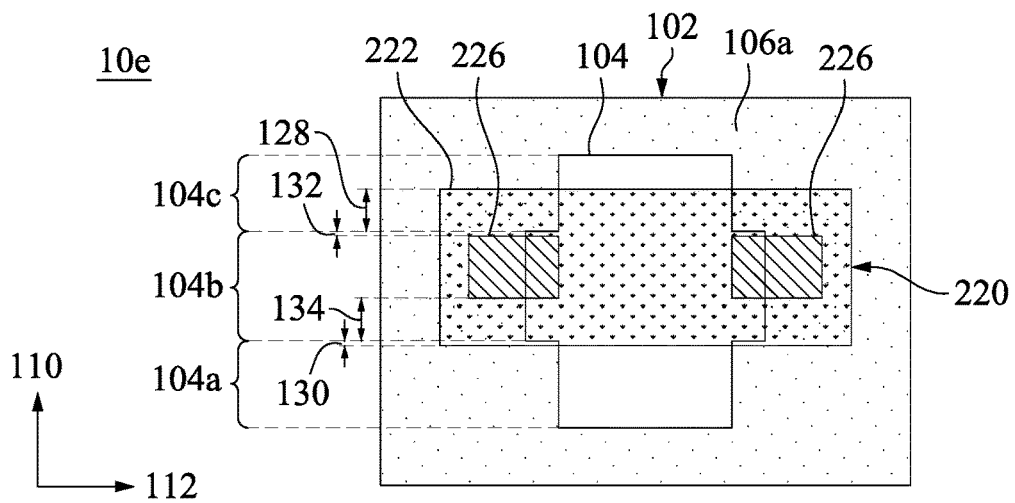
FIGS. 11A-11C illustrate top views showing some alternative embodiments of integrated chips.

FIG. 11A shows another transistor device 10e similar to the transistor device 10b, except for the transistor device 10e being a PMOS device. That is, the first doped region 222 includes p-type dopants while the second doped regions 226 include n-type dopants.

Figure 11B:
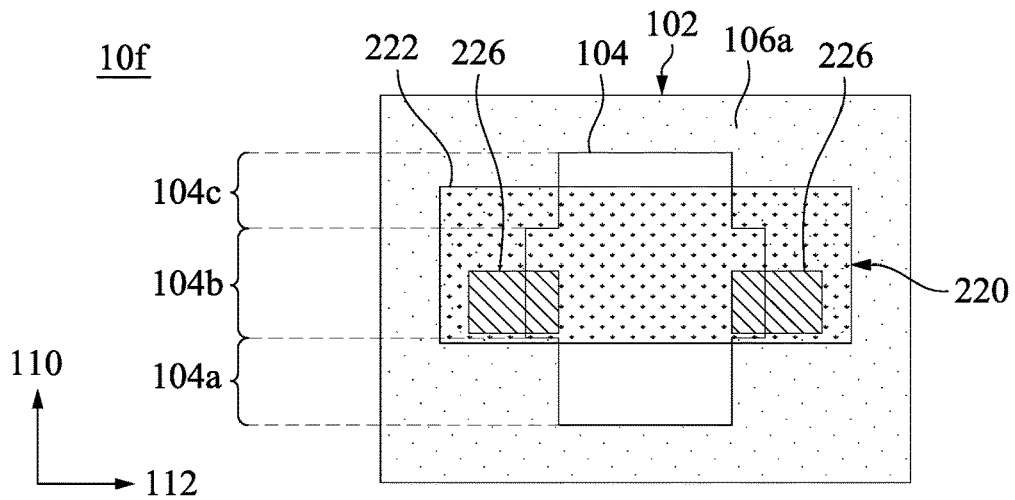

FIG. 11B shows another transistor device 10f similar to the transistor device, except for the transistor device 10f being a PMOS device. That is, the first doped region 222 includes p-type dopants while the second doped regions 226 include n-type dopants.

Figure 11C:
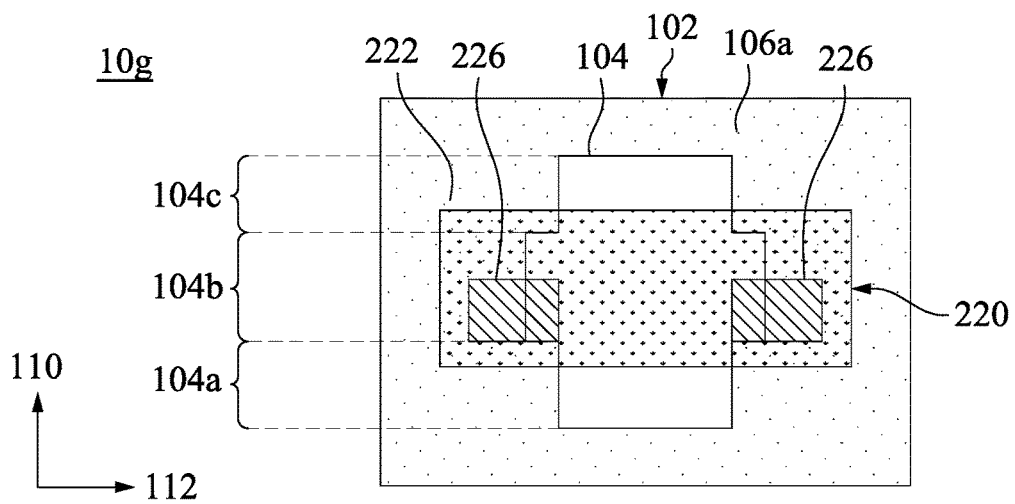

FIG. 11C shows another transistor device 10g similar to the transistor device 10d, except for the transistor device 10d being a PMOS device. That is, the first doped region 222 includes p-type dopants while the second doped regions 226 include n-type dopants.

Figure 12A:
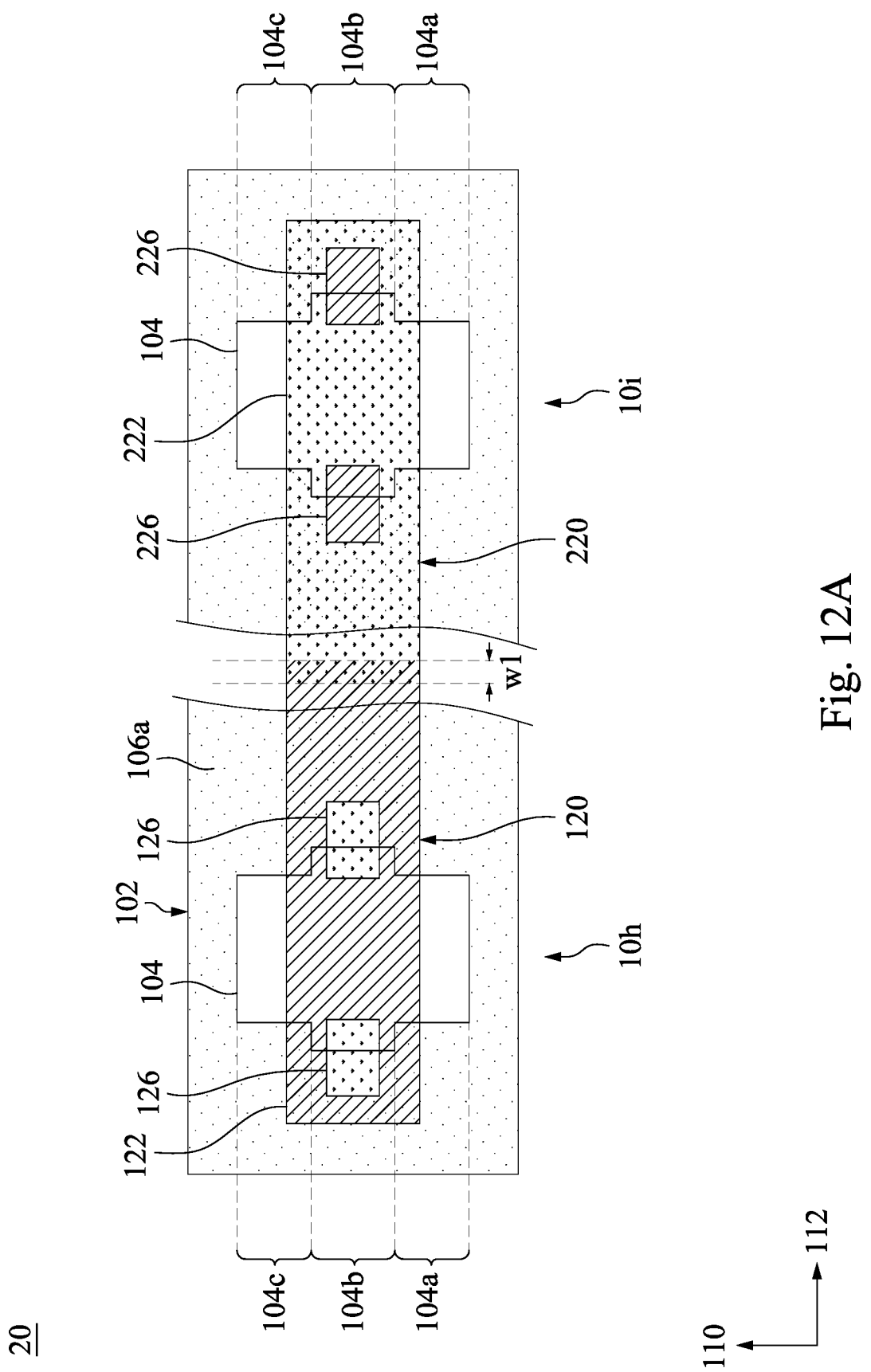
FIGS. 12A-12G illustrate top views showing some alternative embodiments of integrated chips.

FIG. 12A shows an inverter 20 including an n-type transistor device 10h and a p-type transistor device 10i. The n-type transistor device 10h and the p-type transistor device 10i are coupled together to form the inverter 20. The n-type transistor device 10h is an NMOS device and the p-type transistor device 10i is a PMOS device and is adjacent to the n-type transistor device 10h. The n-type transistor device 10h is the same as the transistor device 10 which is discussed previously with respect to FIGS. 5A-5C. The p-type transistor device 10i is similar to the transistor device 10a, which is discussed previously with respect to FIG. 9A-9C. Therefore, the discussions of n-type transistor device 10h and the p-type transistor device 10i will not be repeated for the sake of brevity. The first doped region 122 of the poly gate electrode 120 of the n-type transistor device 10h and the first doped region 122 of the poly gate electrode 120 of the p-type transistor device 10i overlap and an overlapped region thereof have a width w1 along the second direction 112 in a range from about 5 nm to about 500 nm.

Figure 12B:
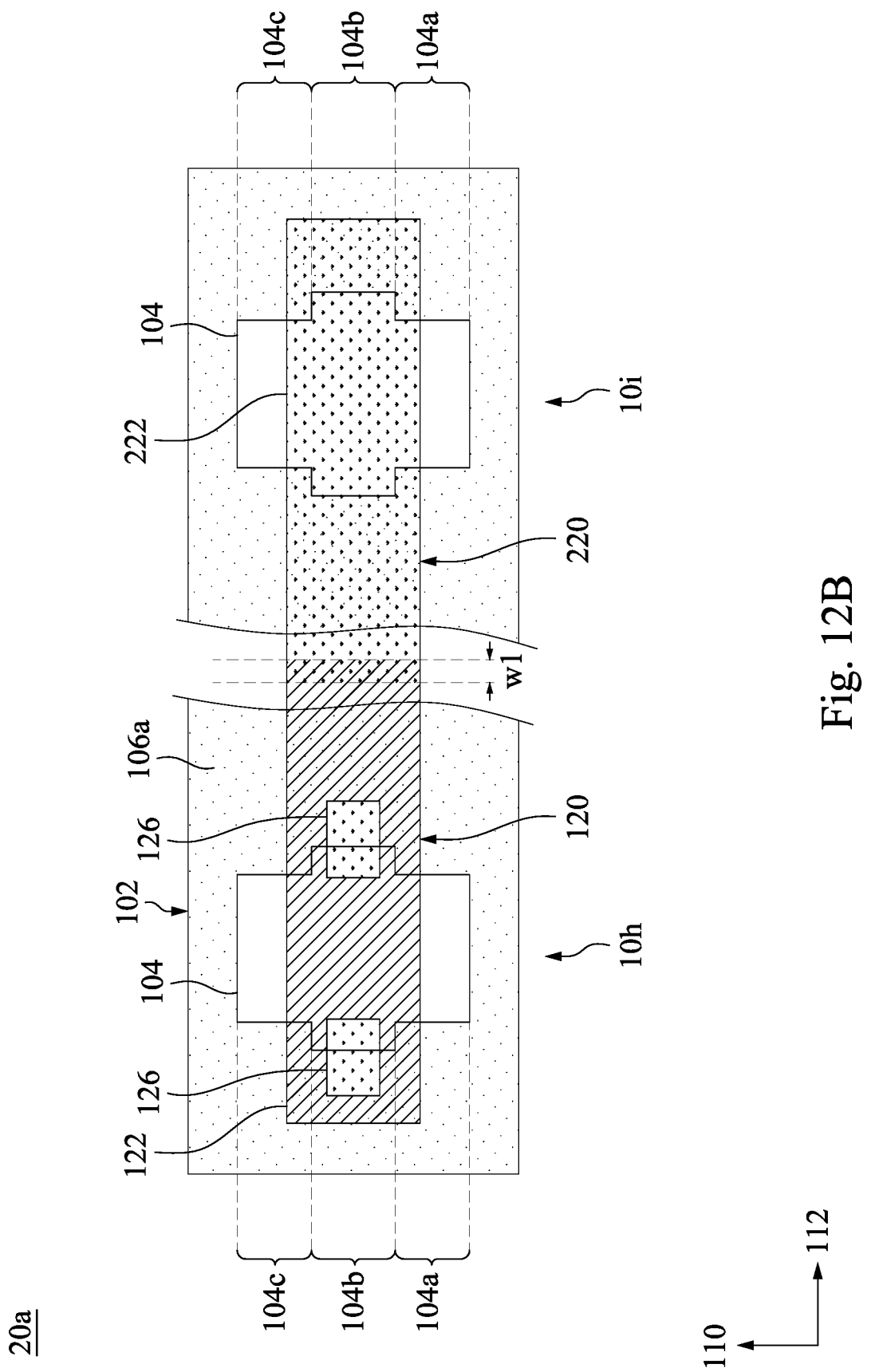

FIG. 12B shows another inverter 20a similar to the inverter 20, except for the second doped regions 226 (see FIG. 12A) are absent in the poly gate electrode 220 of the p-type transistor device 10i of the inverter 20a. That is, the entire poly gate electrode 220 of the p-type transistor device 10i is formed of the first doped region 222.

Figure 12C:
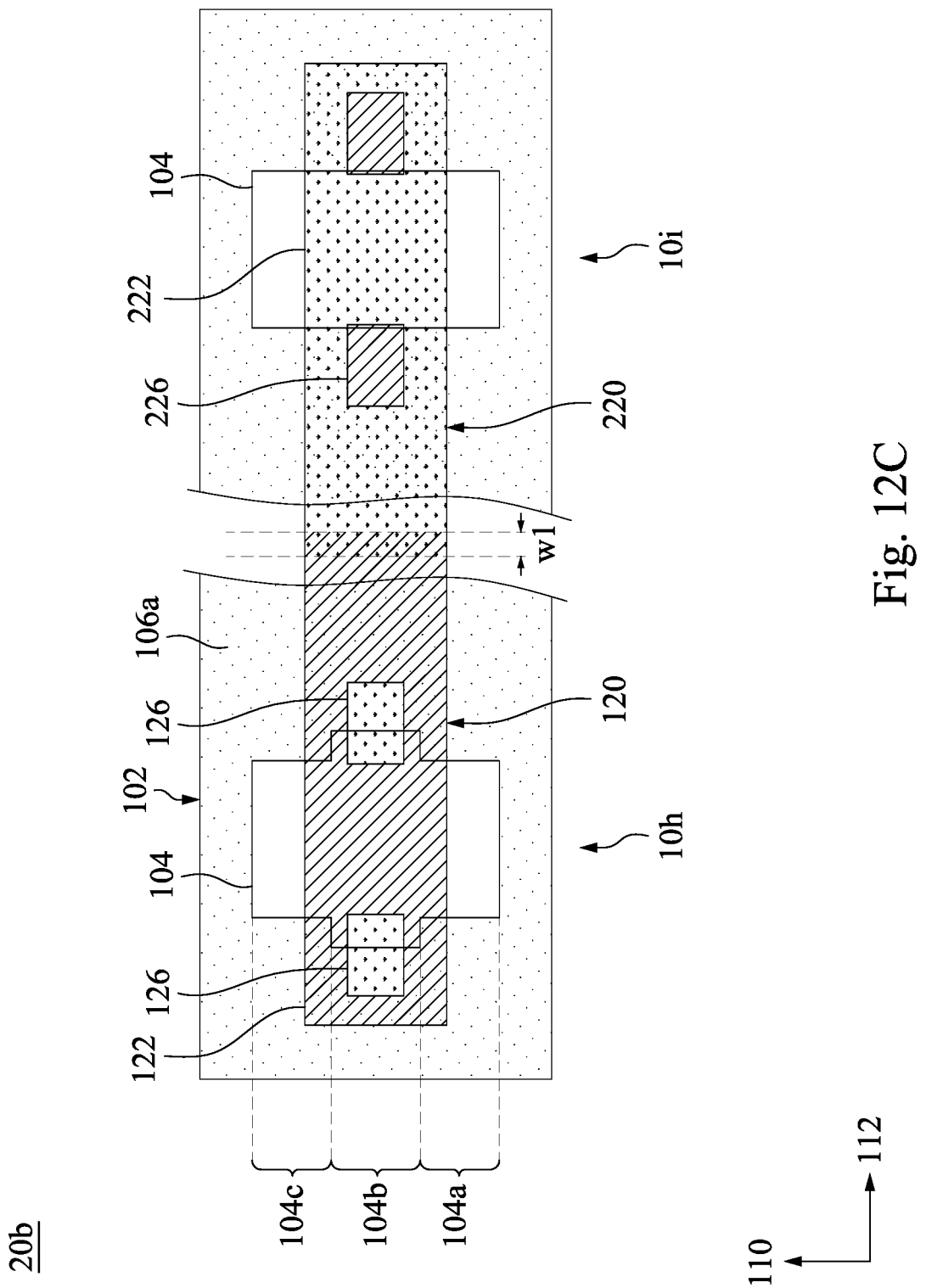

FIG. 12C shows another inverter 20b similar to the inverter 20, except for each parts of the active region 104 of the p-type transistor device 10i of the inverter 20b having the same width.

Figure 12D:
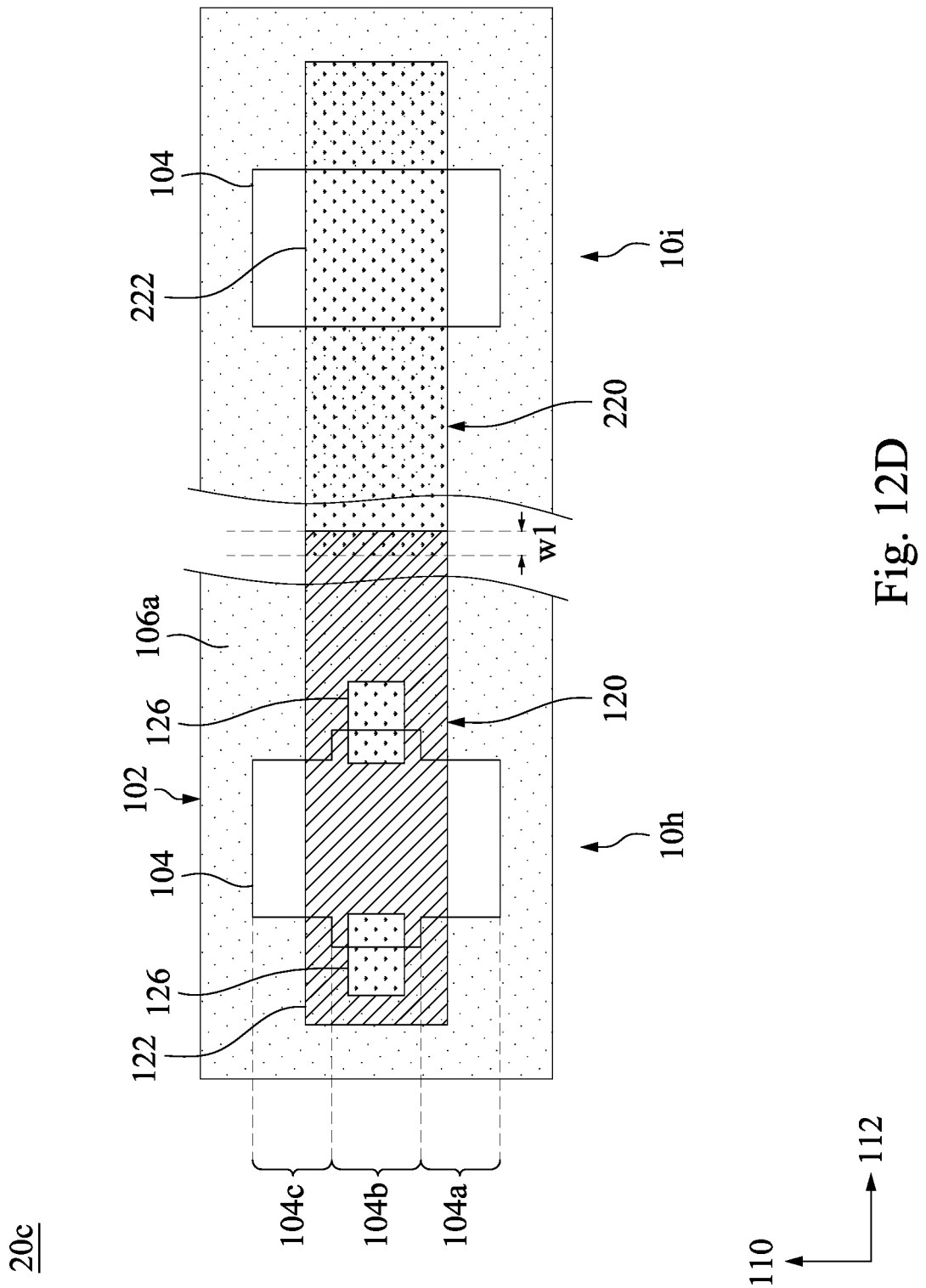

FIG. 12D shows another inverter 20c similar to the inverter 20, except for each parts of the active region 104 of the p-type transistor device 10i of the inverter 20c having the same width and the p-type transistor device 10i of the inverter 20c having no second doped regions 226 (see FIG. 12A). That is, the entire poly gate electrode 220 of the p-type transistor device 10i is formed of the first doped region 222.

Figure 12E:
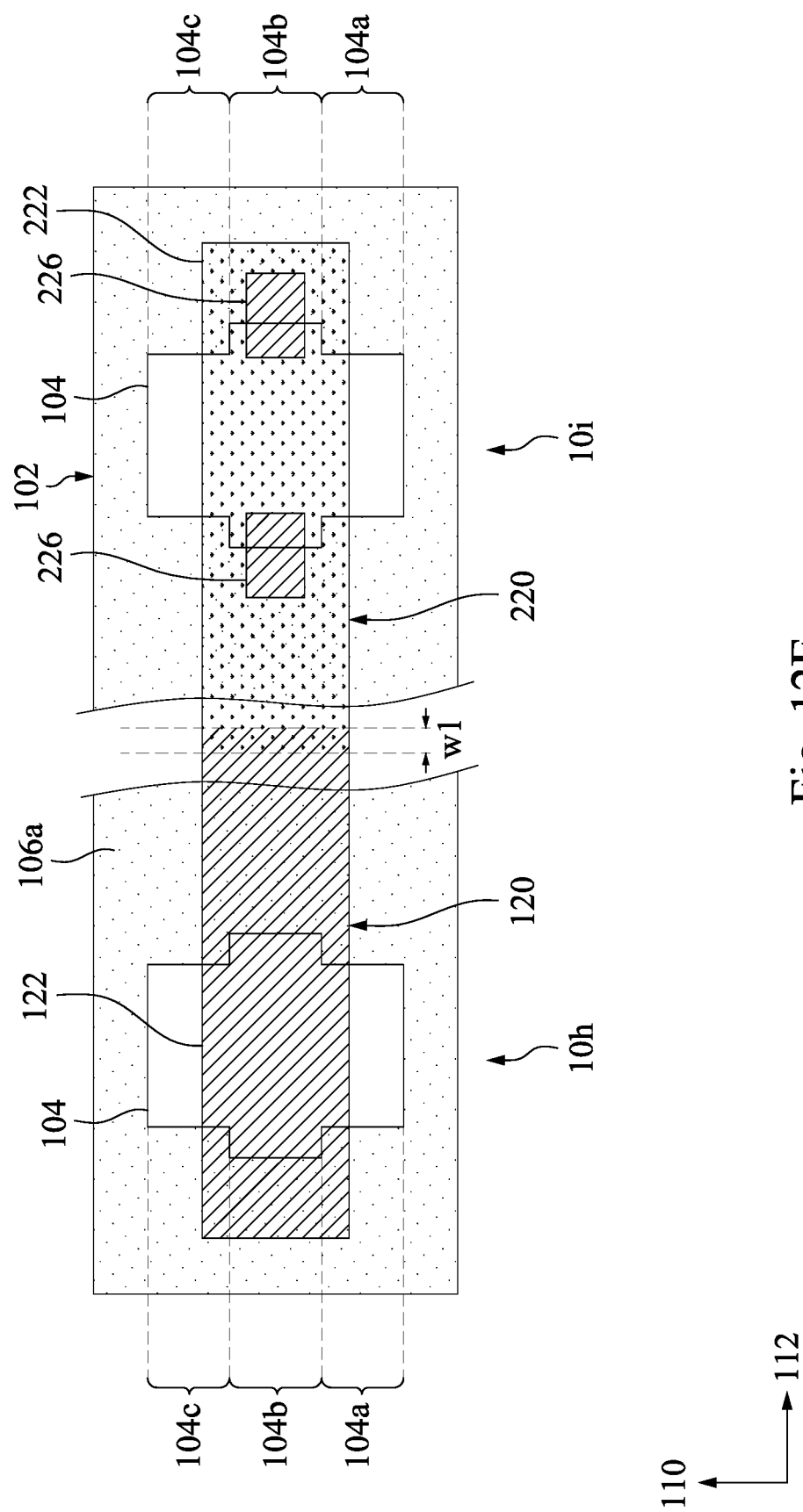

FIG. 12E shows another inverter 20d similar to the inverter 20, except for the n-type transistor device 10h of the inverter have no second doped regions 126 (see FIG. 12A). That is, the entire poly gate electrode 120 of the n-type transistor device 10h is formed of the first doped region 122.

Figure 12F:
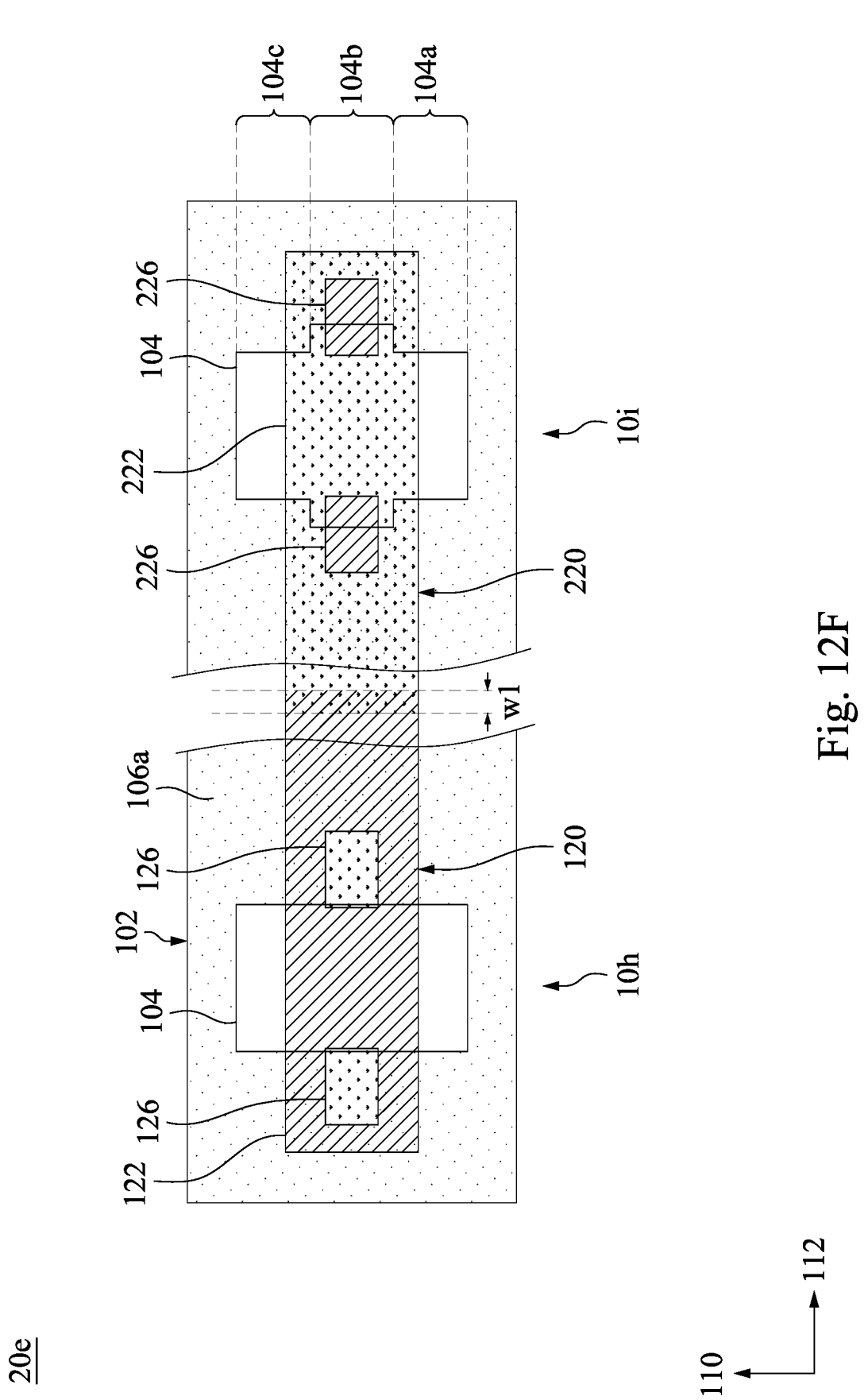

FIG. 12F shows another inverter 20e similar to the inverter 20, except for each parts of the active region 104 of the n-type transistor device 10h of the inverter 20e have the same width.

Figure 12G:
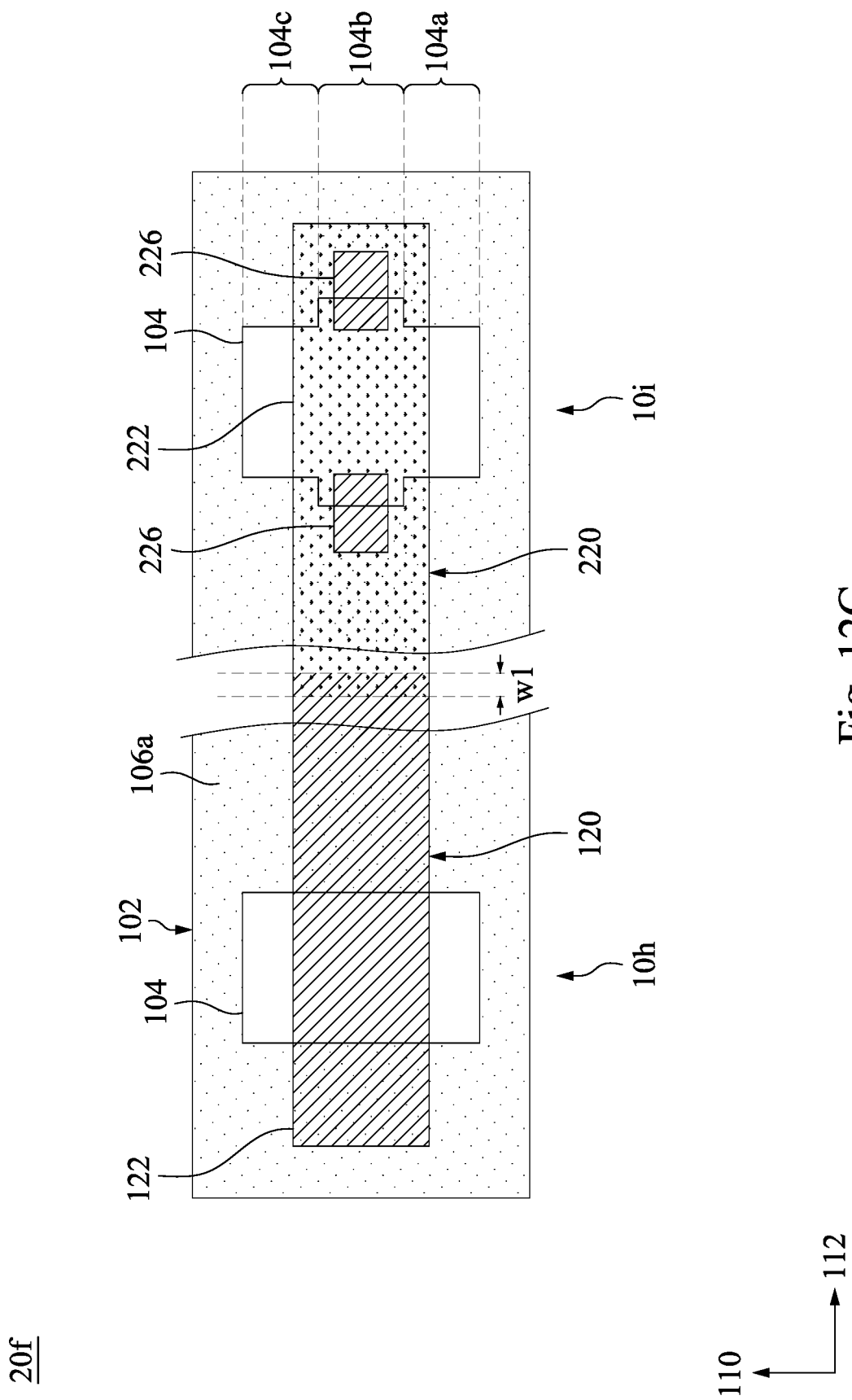

FIG. 12G shows another inverter 20f similar to the inverter 20, except for the each parts of the active region 104 of the n-type transistor device 10h of the inverter 20f having the same width and the n-type transistor device 10h of the inverter 20f have no second doped regions 126. That is, the entire poly gate electrode 120 of the n-type transistor device 10h is formed of the first doped region 122.

Figure 13A:
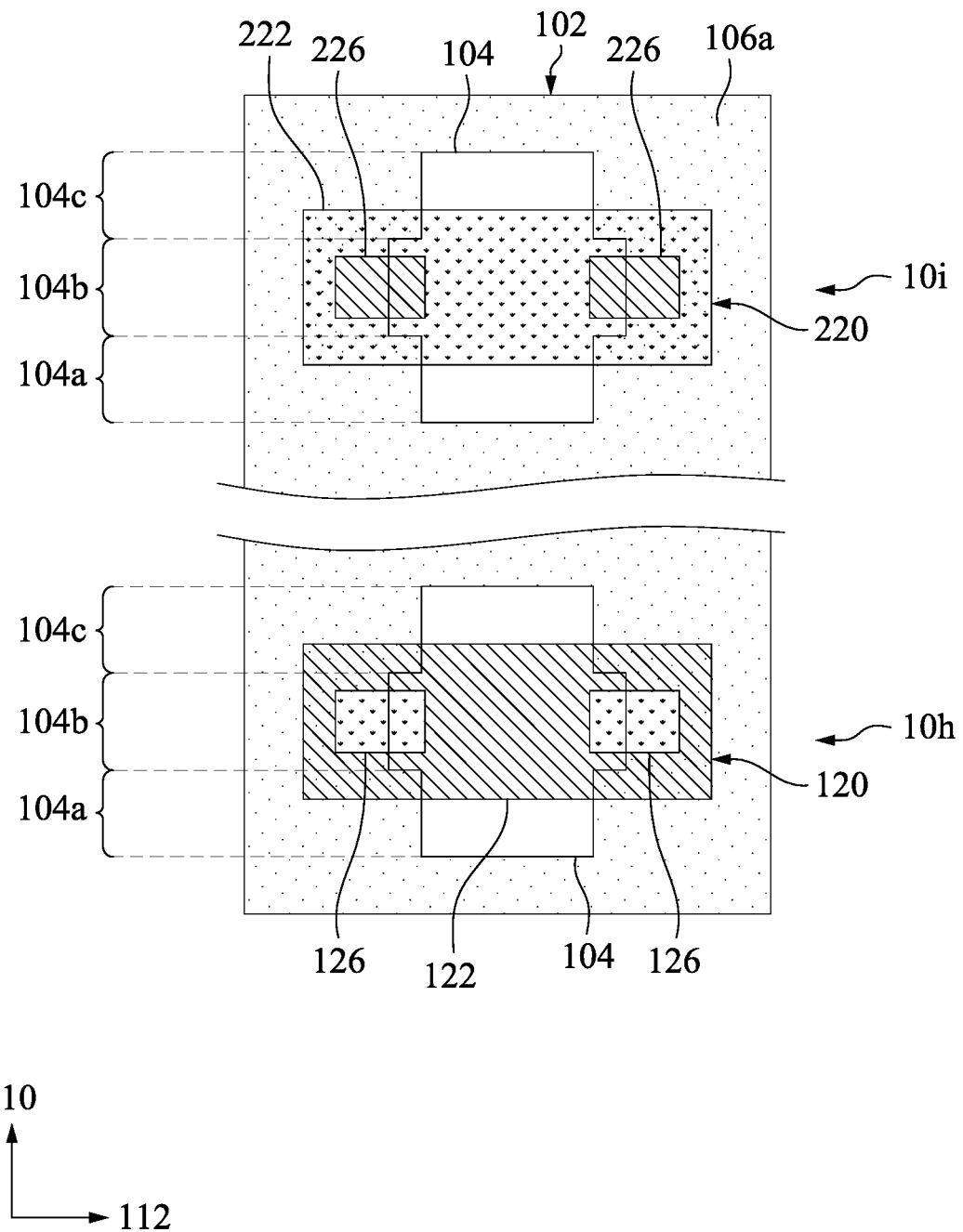
FIGS. 13A-13G illustrate top views showing some alternative embodiments of integrated chips.

FIG. 13A shows another inverter 30 similar to the inverter 20, except for the poly gate electrode 120 of the n-type transistor device 10h and the poly gate electrode 120 of the p-type transistor device 10i being spaced apart along the first direction 110.

Figure 13B:
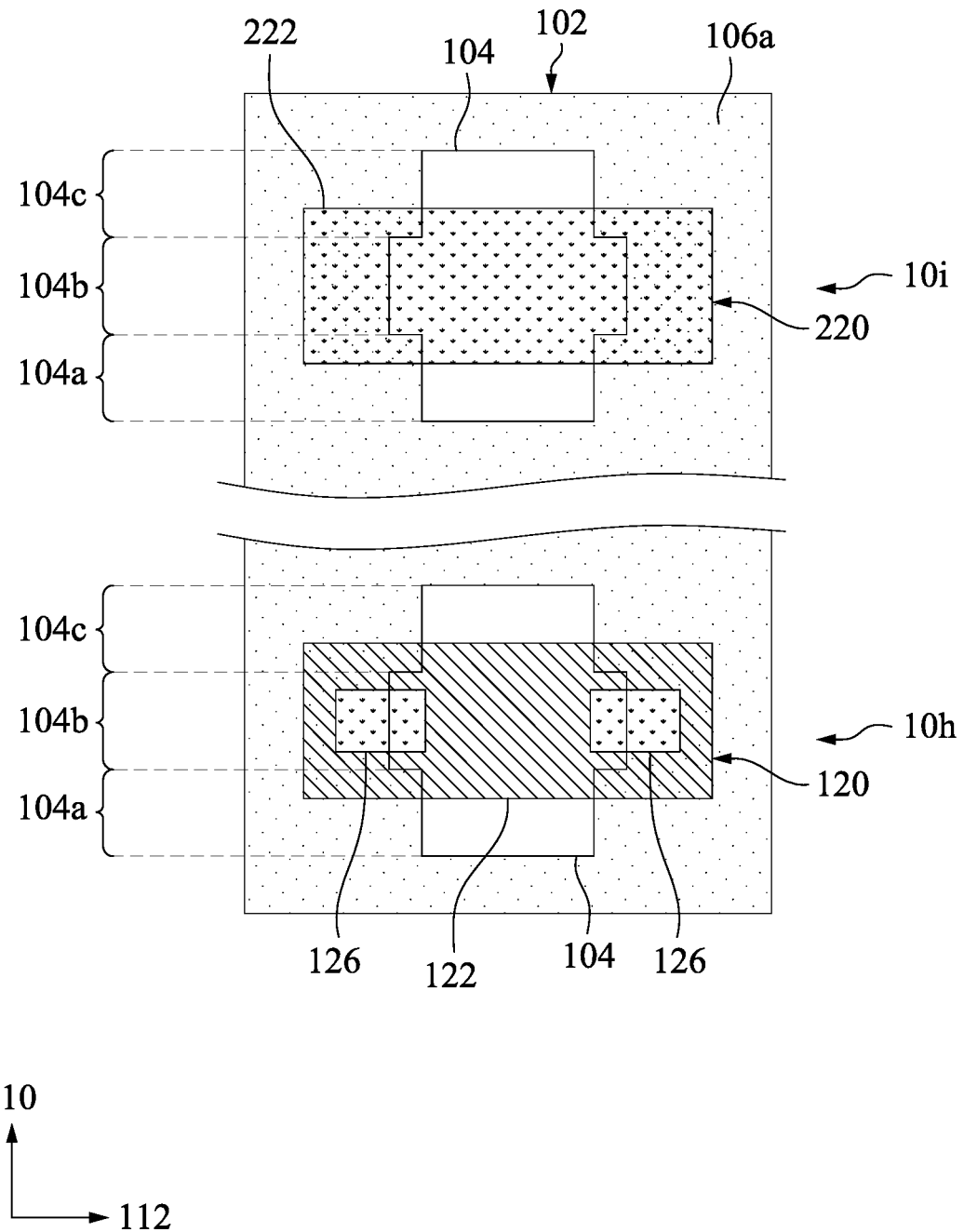

FIG. 13B shows another inverter 30a similar to the inverter 30, except for the p-type transistor device 10i of the inverter 30a having no second doped regions 126. That is, the entire poly gate electrode 120 of the p-type transistor device 10i is formed of the first doped region 222.

Figure 13C:
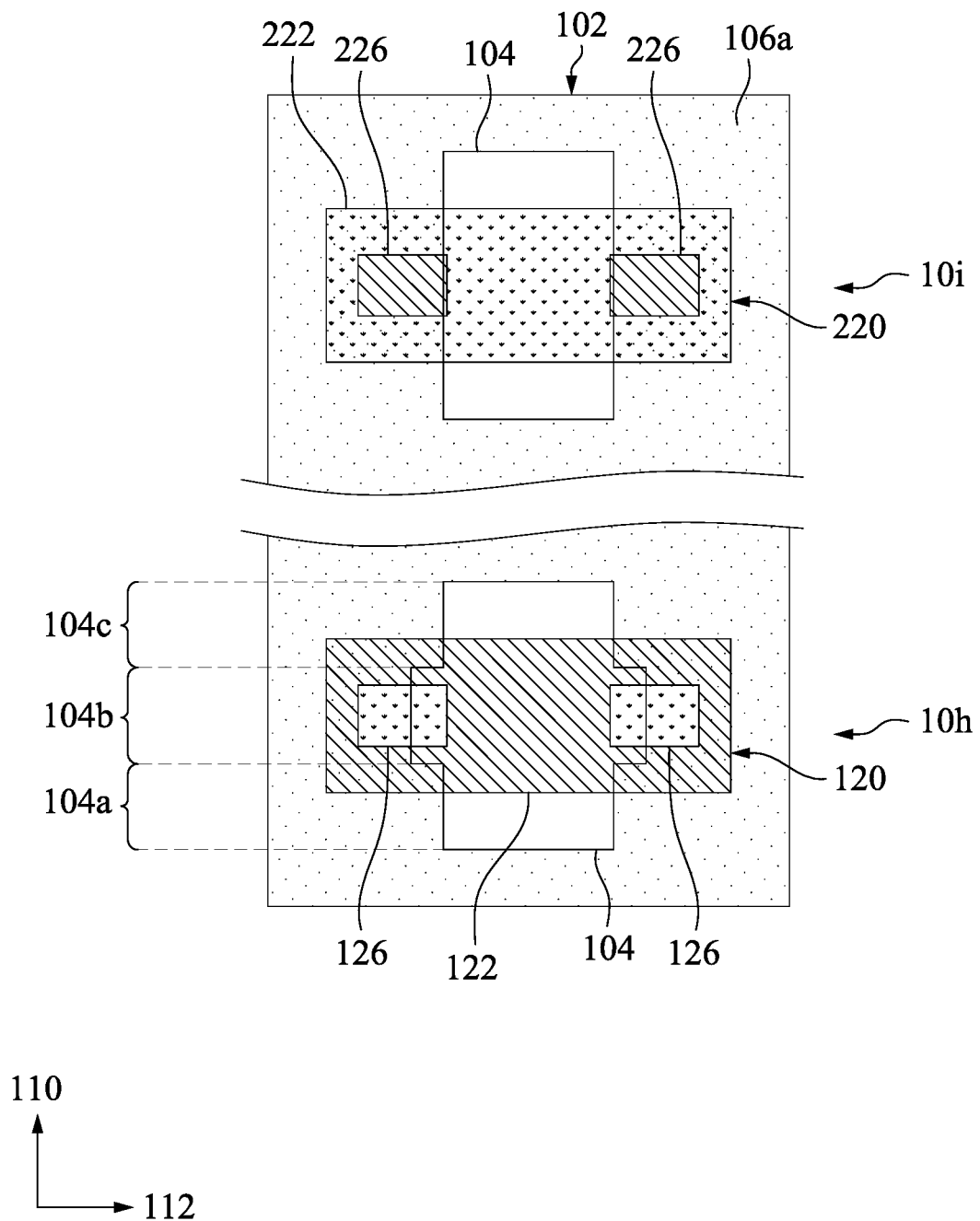

FIG. 13C shows another inverter 30b similar to the inverter 30, except for each parts of the active region 104 of the p-type transistor device 10i of the inverter 30b having the same width.

Figure 13D:
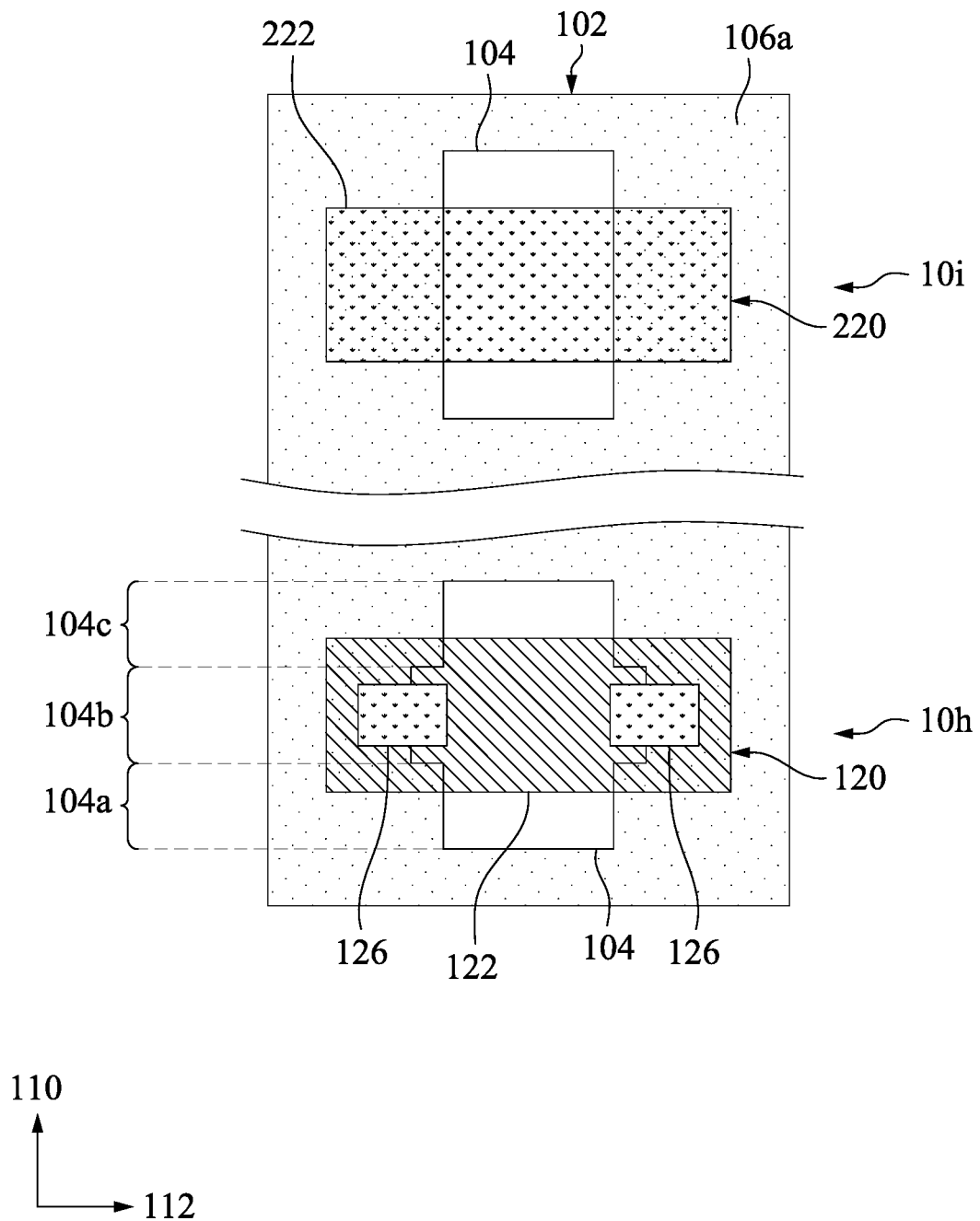

FIG. 13D shows another inverter 30c similar to the inverter 30, except for each parts of the active region 104 of the p-type transistor device 10i of the inverter 30 having the same width and the p-type transistor device 10i of the inverter 30c having no second doped regions 226 (see FIG. 13A). That is, the entire poly gate electrode 220 of p-type transistor device 10i is formed of the first doped region 222.

Figure 13E:
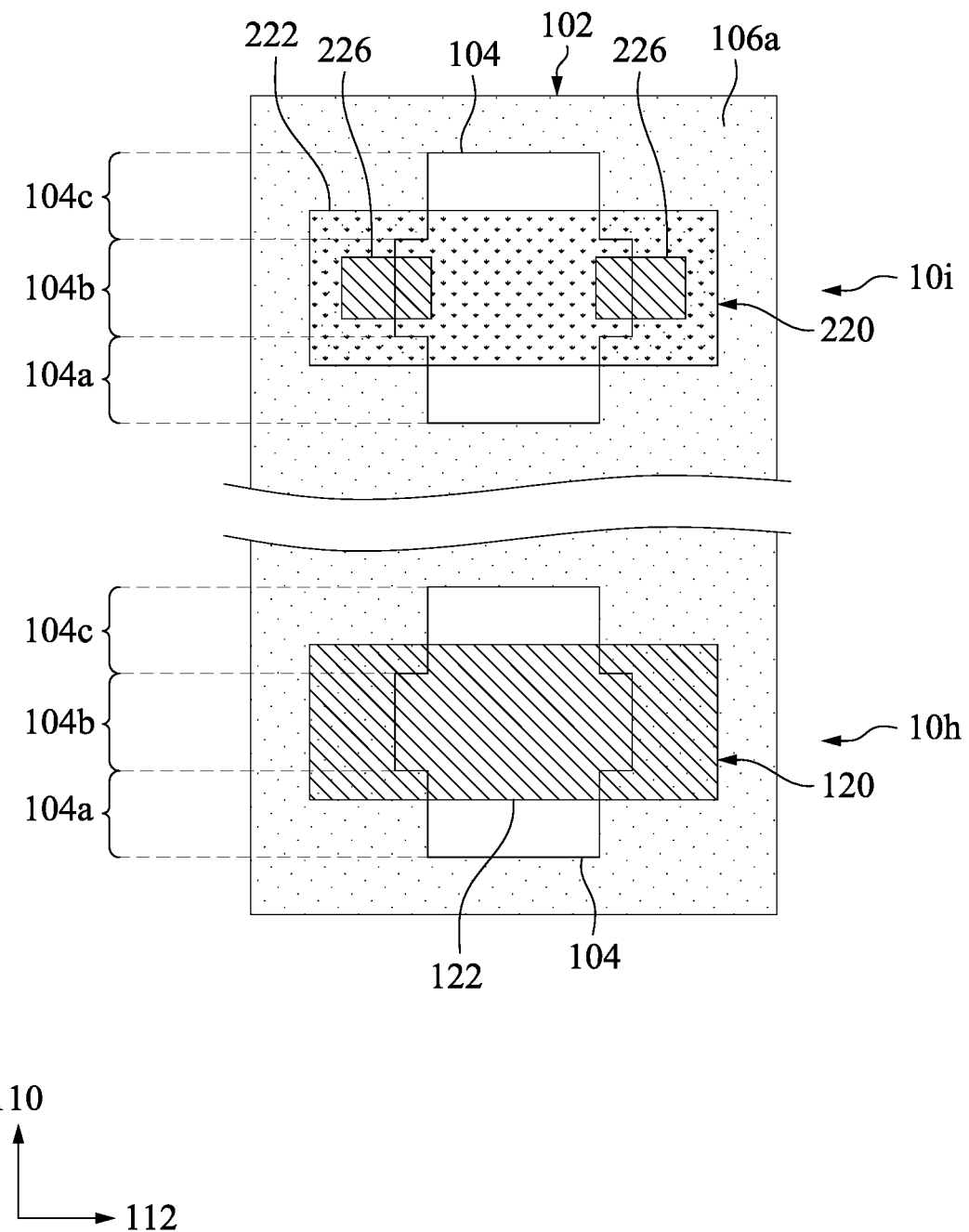

FIG. 13E shows another inverter 30d similar to the inverter 30, except for the n-type transistor device 10h of the inverter 30d having no second doped regions 126. That is, the entire poly gate electrode 120 of the n-type transistor device 10h is formed of the first doped region 122.

Figure 13F:
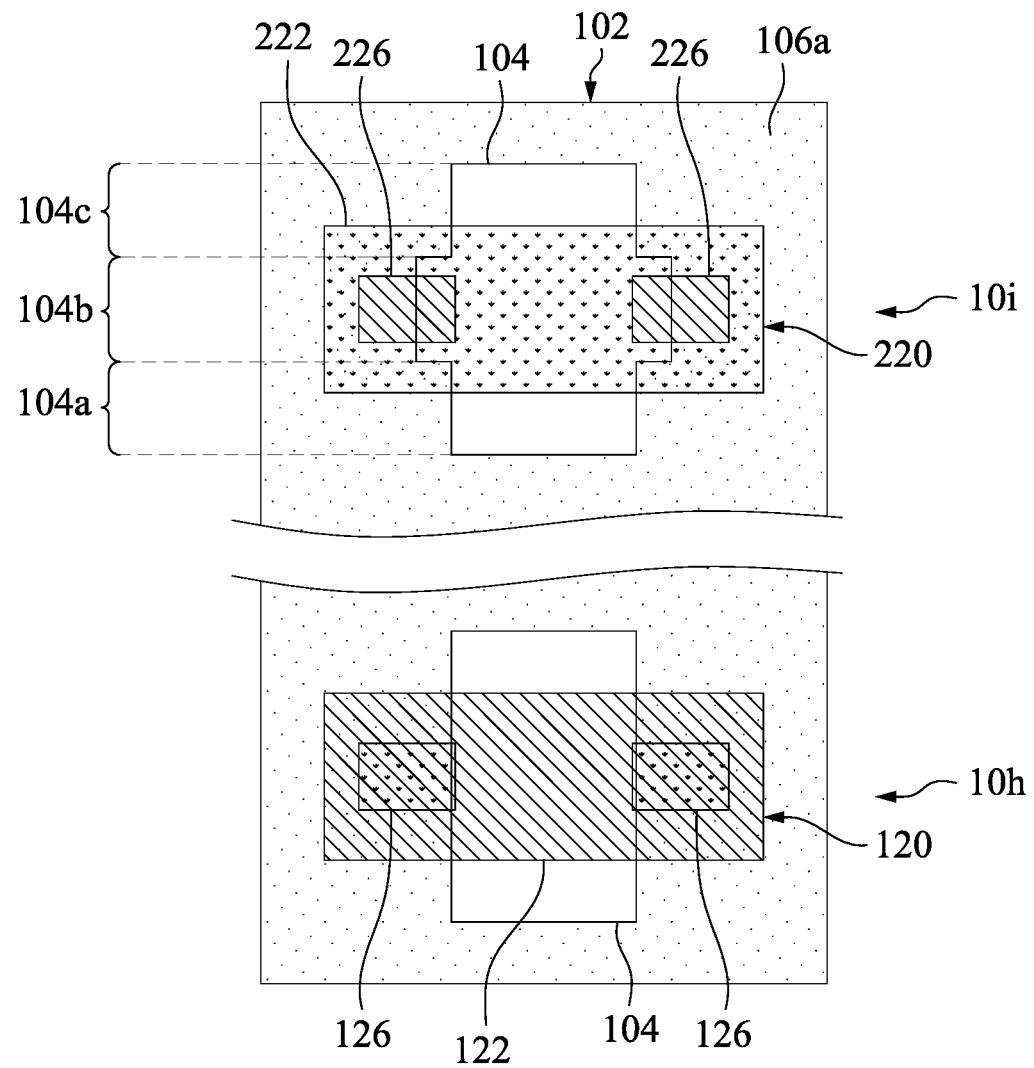

FIG. 13F shows another inverter 30e similar to the inverter 30, except for each parts of the active region 104 of the n-type transistor device 10h of the inverter 30e having the same width.

Figure 13G:
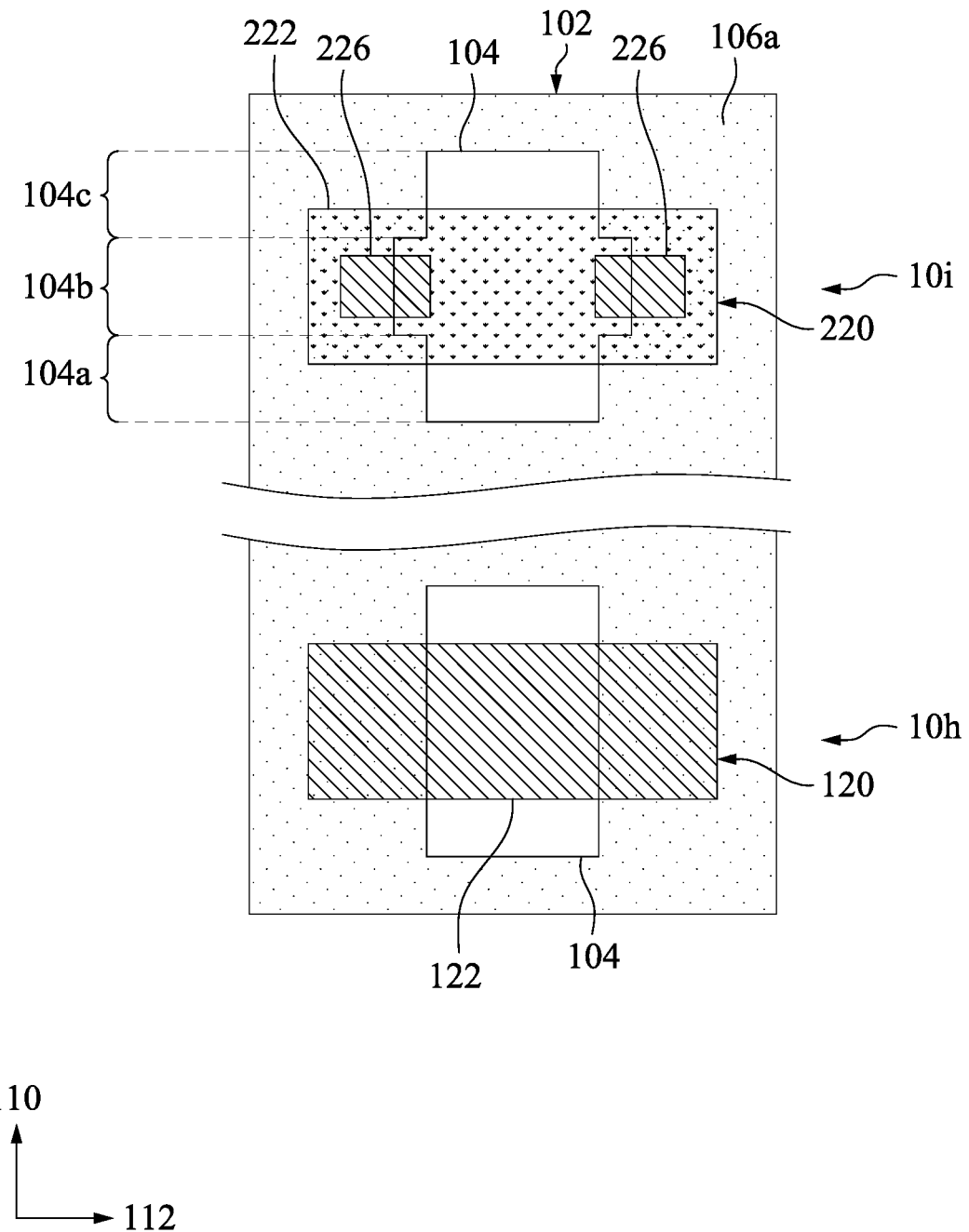

FIG. 13G shows another inverter 30f similar to the inverter 30, except for each parts of the n-type transistor device 10h of the inverter 30f having the same width and the n-type transistor device 10h of the inverter 30f having no second doped regions 126. That is, the entire poly gate electrode 120 of the n-type transistor device 10h is formed of the first doped region 122.

Figure 14A:
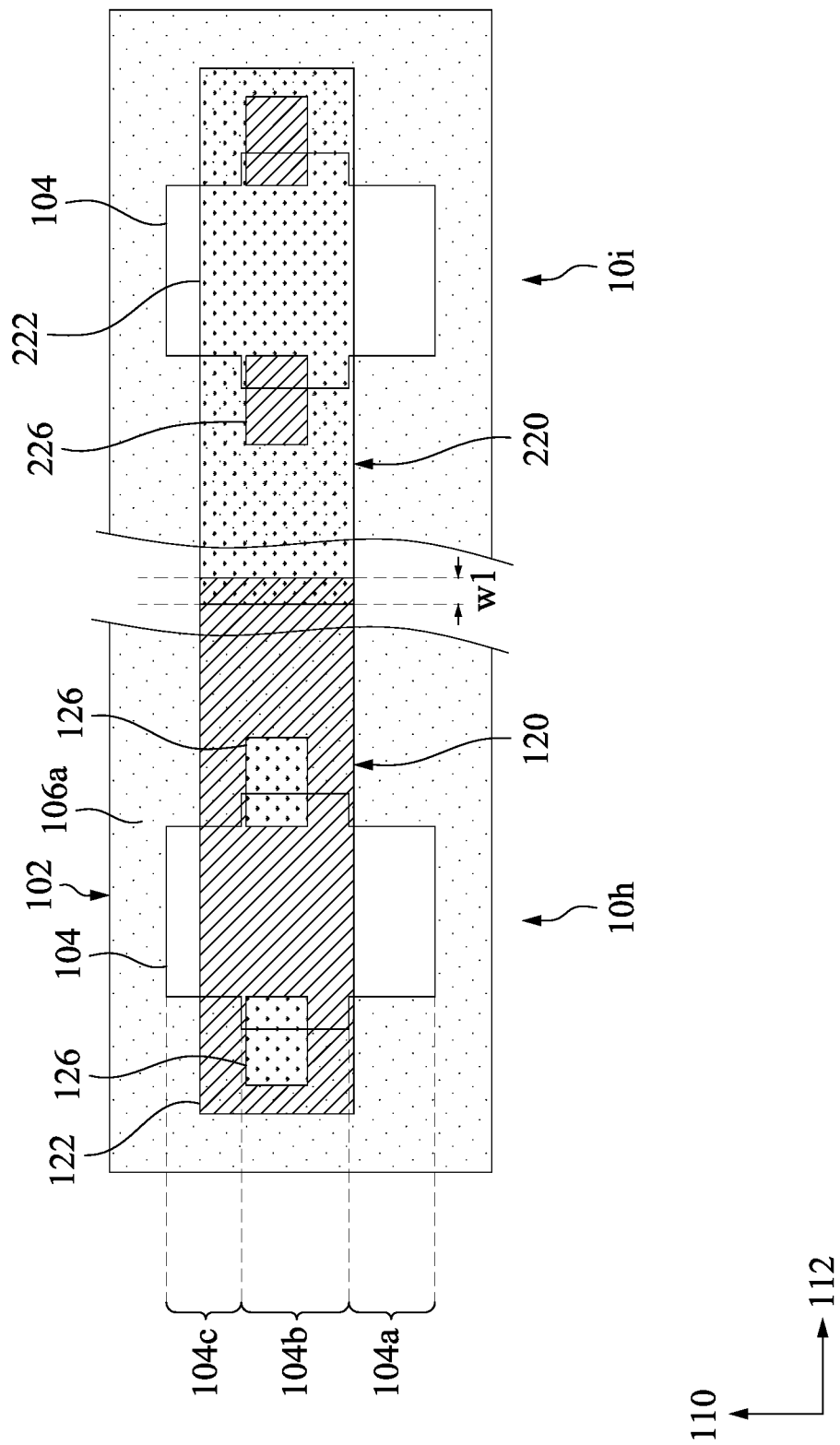

FIG. 14A shows another inverter 40 similar to the inverter 20, except for the poly gate electrode 120 of the n-type transistor device 10h being asymmetric with respect to the channel region 104b and the poly gate electrode 220 of the p-type transistor device 10i being asymmetric with respect to the channel region 104b as well. For example, the first and second doped regions 122, 126 of the n-type transistor device 10h are asymmetric with respect to the channel region 104b and the and the first and second doped regions 222, 226 of the p-type transistor device 10i are asymmetrical to the channel region 104b, as discussed previously with respect to FIG. 10A.

Figure 14B:
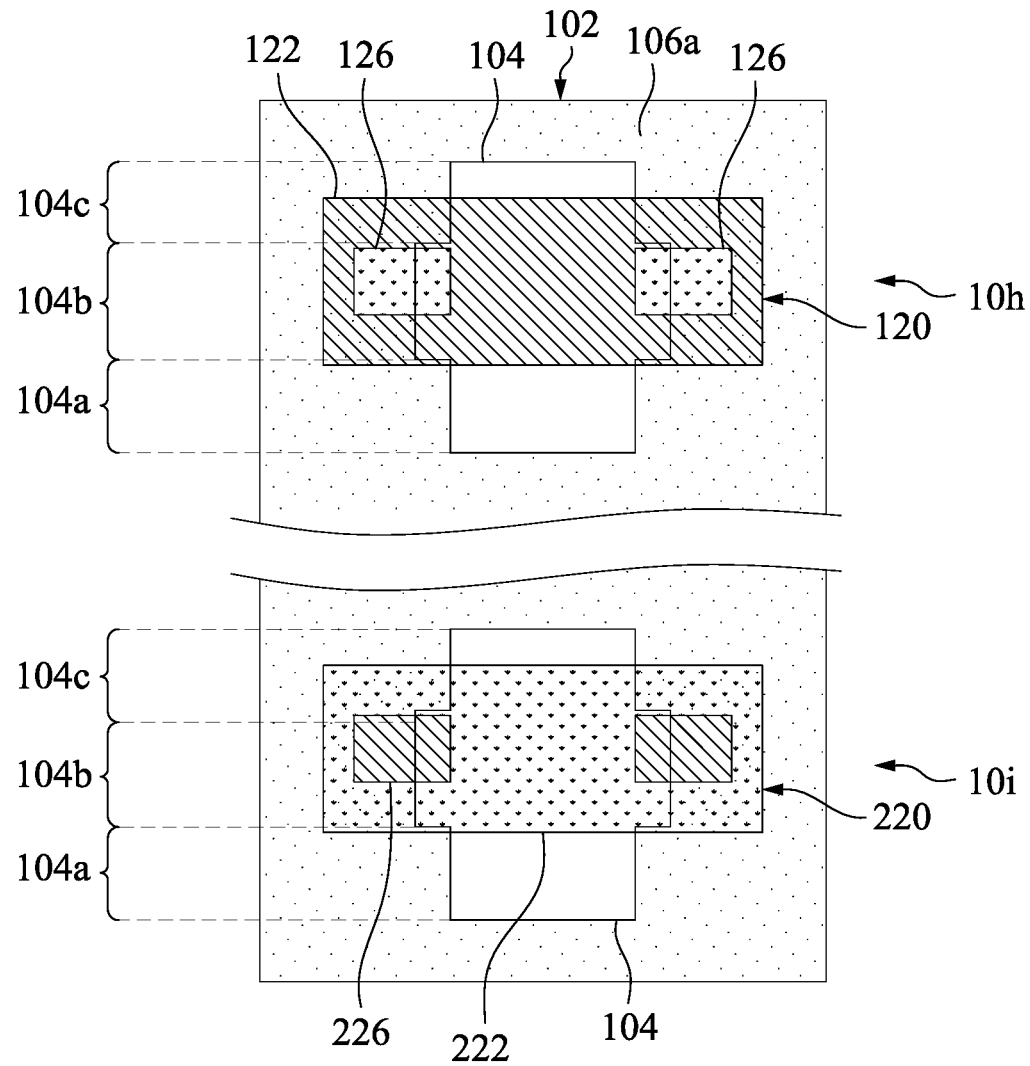

FIG. 14B shows another inverter 40a similar to the inverter 40, except for the poly gate electrode 120 of the n-type transistor device 10h and the poly gate electrode 220 of the p-type transistor device 10i are spaced apart along the first direction 110 by a distance.

Figure 14C:
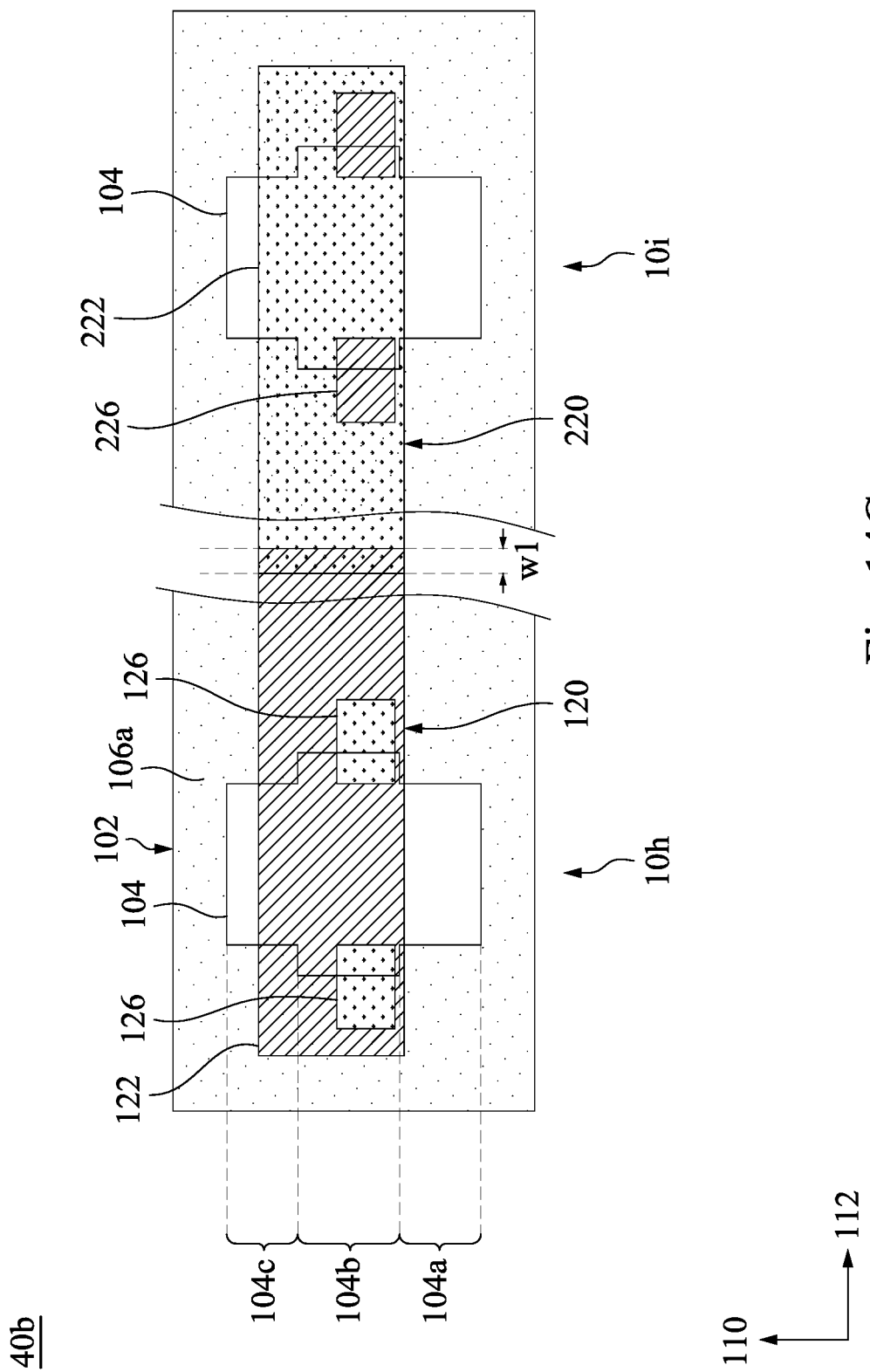

FIG. 14C shows another inverter 40b similar to the inverter 40a, except for the second doped regions 126 of the n-type transistor device 10h being symmetric with respect to the center of the first doped region 122 of the poly gate electrode 120 and the second doped regions 226 of the p-type transistor device 10i being symmetric with respect to the center of the poly gate electrode 220.

Figure 14D:
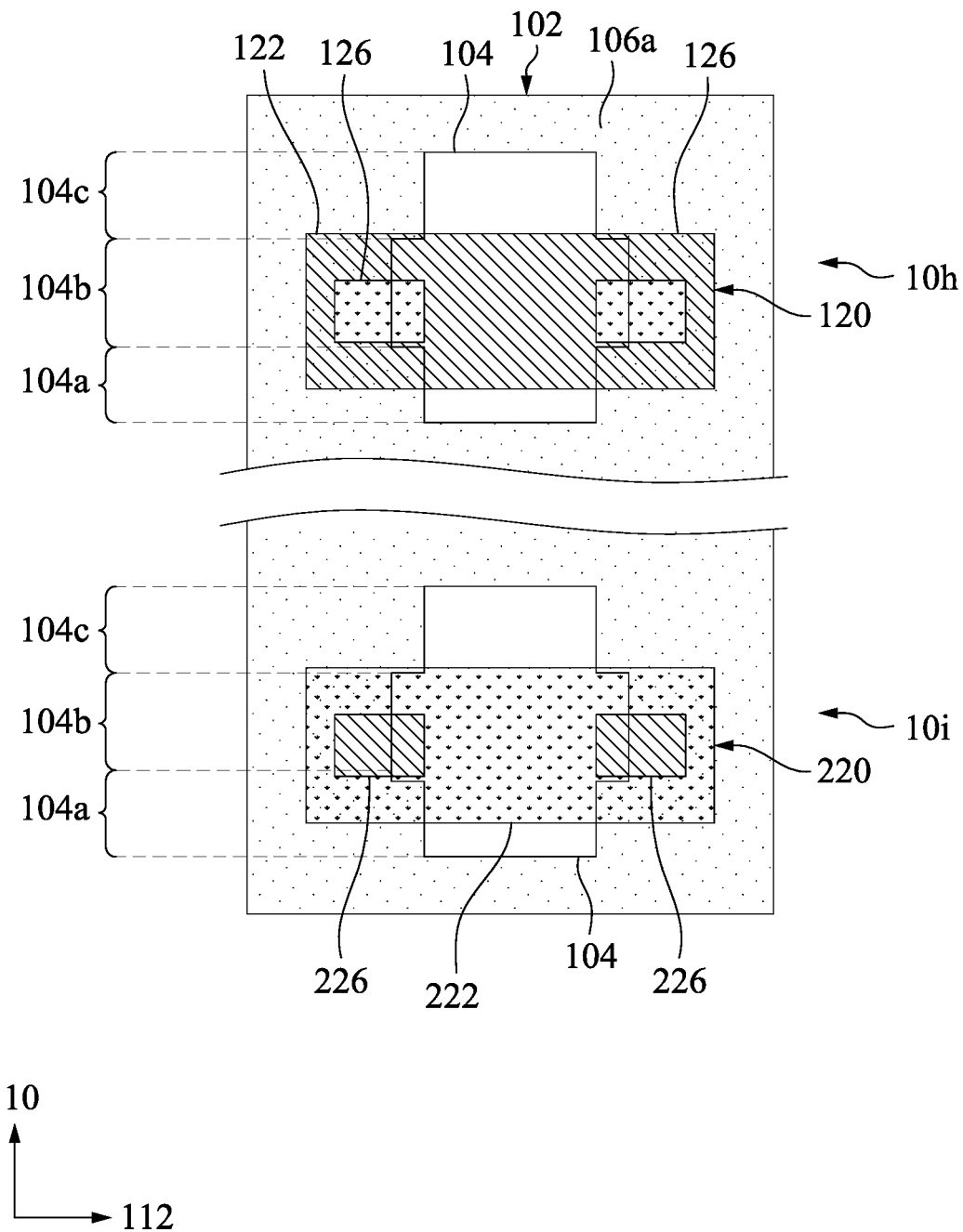

FIG. 14D shows another inverter 40c similar to the inverter 40b, except for the poly gate electrode 120 of the n-type transistor device 10h and the poly gate electrode 220 of the p-type transistor device 10i are spaced apart along the first direction 110 by a distance.

Figure 14E:
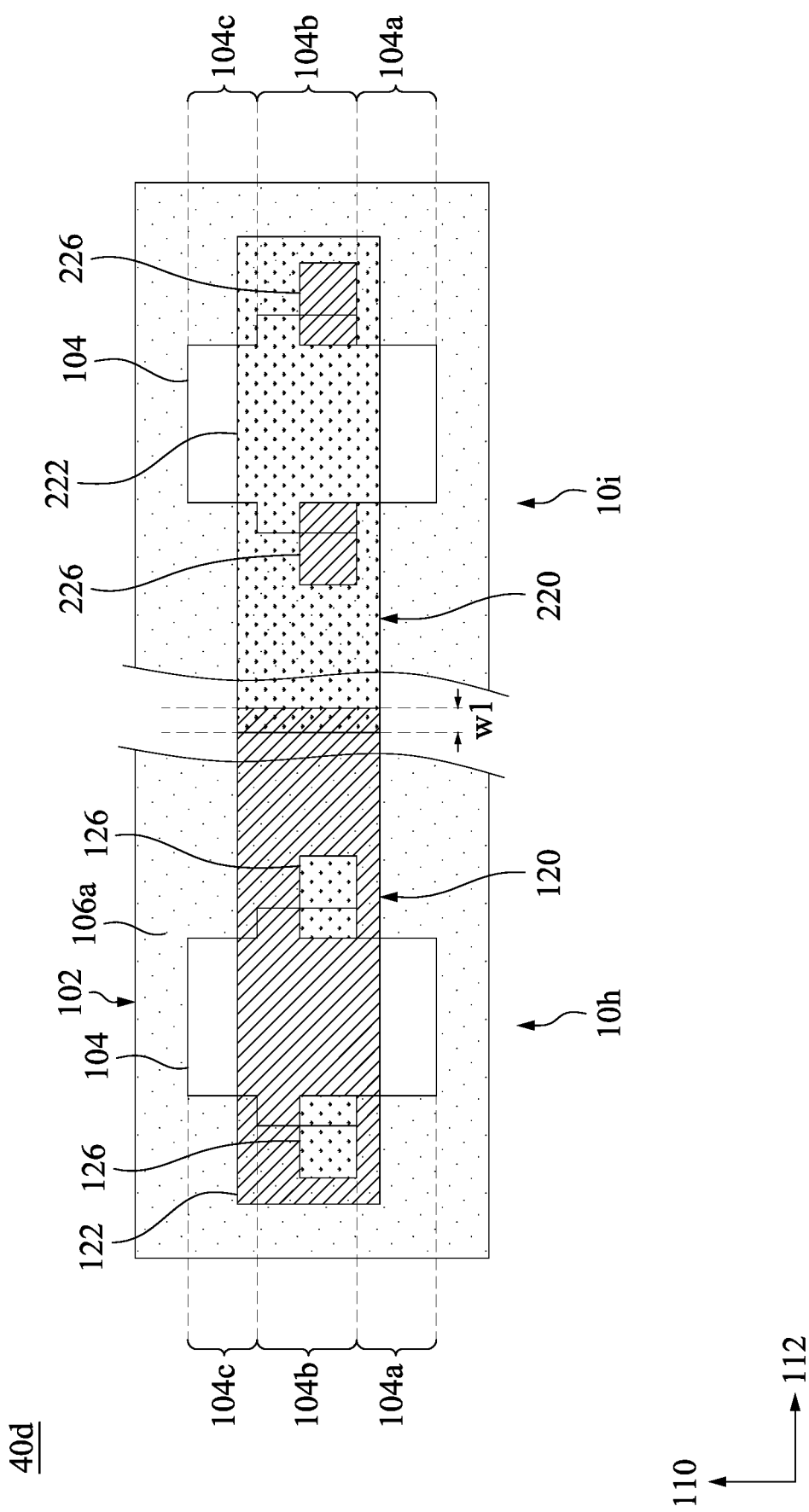

FIG. 14E shows another inverter 40d similar to the inverter 40b, except for the positions of the first doped region 122 of the n-type transistor device 10h being symmetric with respect to the channel region 104b and the boundary of the second doped regions 126 of the n-type transistor device 10h overlapping the boundary of the channel region 104b along the second direction 112 and except for the positions of the first doped regions 222 of the p-type transistor device 10i being symmetric with respect to the channel region 104b and the boundary of the second doped regions 226 of the p-type transistor device 10i overlapping the boundary of the channel region 104b along the second direction 112. For example, the fourth distance 134 (see FIG. 10B) equals to zero.

FIG. 14F shows another inverter 40e similar to the inverter 40e, except for the poly gate electrode 120 of the n-type transistor device 10h and the poly gate electrode 220 of the p-type transistor device 10i are spaced apart along the first direction 110 by a distance.

Figure 15A:
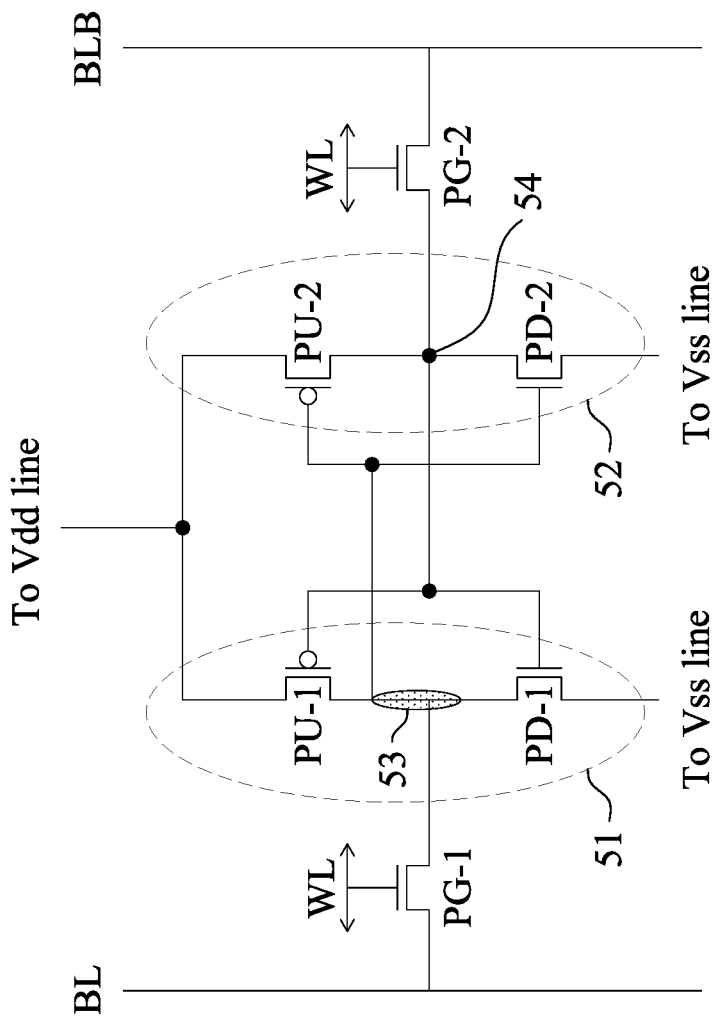
FIG. 15A is a circuit diagram of a six transistor (6T) static random-access memory (SRAM) according to various embodiments.
Figure 15B:
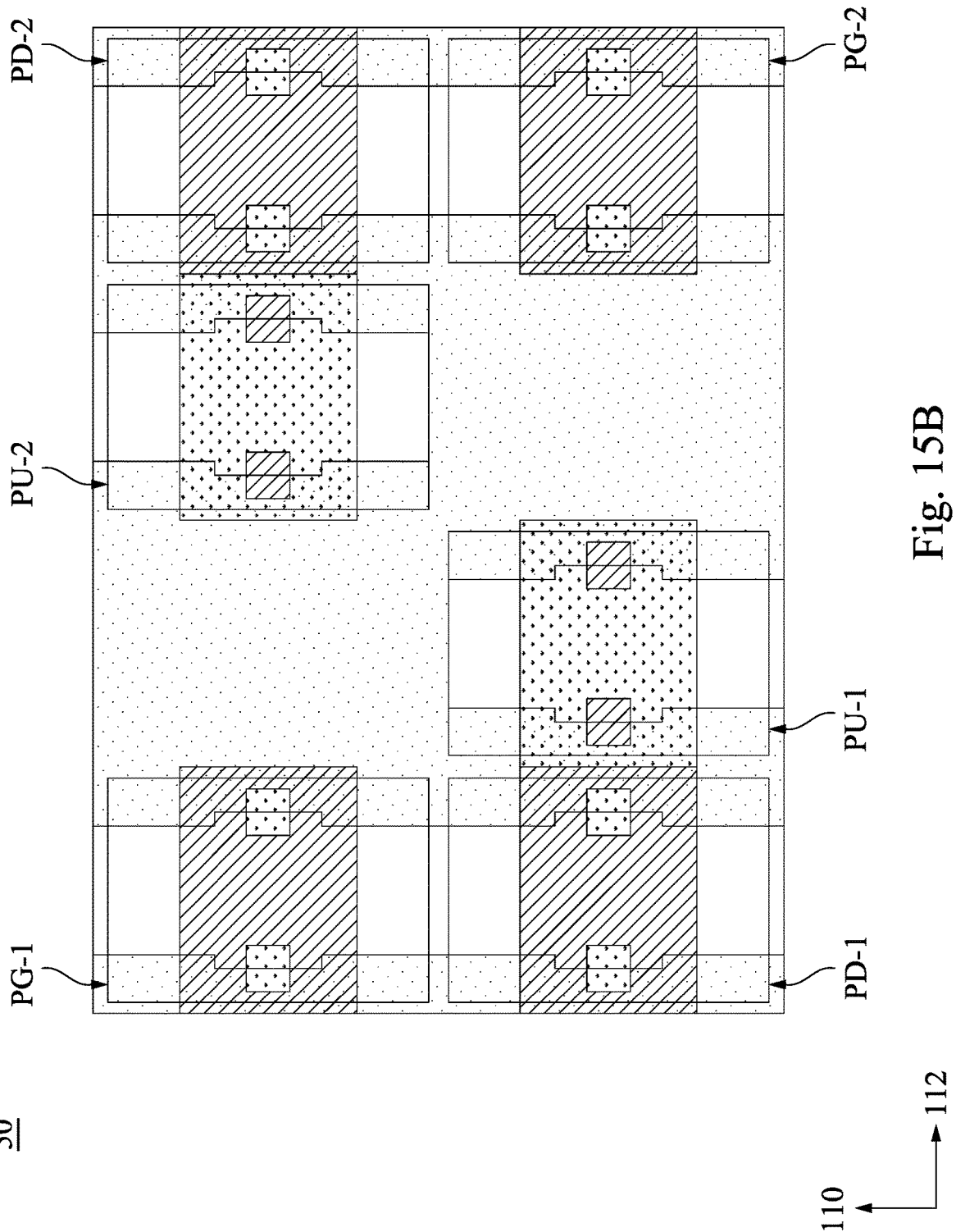
FIG. 15B shows a plan layout of the SRAM cell in FIG. 15A.

FIG. 15A is a circuit diagram of a six transistor (6T) static random-access memory (SRAM) cell 50 according to various embodiments. FIG. 15B shows a plan layout of the SRAM cell 50 in FIG. 15A. Reference is made to FIGS. 15A and 15B. SRAM cell 50 is a type of volatile semiconductor memory that uses bistable latching circuitry to store each bit. Each bit in an SRAM cell 50 is stored on four transistors (PU-1, PU-2, PD-1, and PD-2) that form two cross-coupled inverters. This memory cell has two stable states which are used to denote 0 and 1. Two additional access transistors (PG-1 and PG-2) serve to control the access to a storage cell during read and write operations. A typical SRAM uses six MOSFETs to store each memory bit. The SRAM cell 50 comprises a first inverter 51 formed by a pull-up p-type metal oxide semiconductor (PMOS) transistor PU-1 and a pull-down n-type metal oxide semiconductor (NMOS) transistor PD-1. The SRAM cell 50 further includes a second inverter 52 formed by a pull-up PMOS transistor PU-2 and a pull-down NMOS transistor PD-2. Furthermore, both the first inverter 51 and second inverter 52 are coupled between a voltage bus Vdd and a ground potential Vss.

The first inverter 51 and the second inverter 52 are cross-coupled. That is, the first inverter 51 has an input connected to the output of the second inverter 52. Likewise, the second inverter 52 has an input connected to the output of the first inverter 51. The output of the first inverter is referred to as a storage node SN 53. Likewise, the output of the second inverter is referred to as a storage node SNB 54. In a normal operating mode, the storage node SN 53 is in the opposite logic state as the storage node SNB 54. By employing the two cross-coupled inverters, the SRAM cell 50 can hold the data using a latched structure so that the stored data will not be lost without applying a refresh cycle as long as power is supplied through Vdd.

In an SRAM array (not shown) using the 6T SRAM cells, the cells are arranged in rows and columns. The columns of the SRAM array are formed by a bit line pairs, namely a first bit line BL and a second bit line BLB. The cells of the SRAM array are disposed between the respective bit line pairs. As shown in FIG. 15A, the SRAM cell 50 is placed between the bit line BL and the bit line BLB.

As shown in FIG. 15A, the SRAM cell 50 further comprises a first pass-gate transistor PG-1 connected between the bit line BL and the output 53 of the first inverter 51. The SRAM cell 50 further comprises a second pass-gate transistor PG-2 connected between the bit line BLB and the output 54 of the second inverter 52. The gates of the first pass-gate transistor PG-1 and the second pass-gate transistor PG-2 are connected to a word line (WL), which connects SRAM cells in a row of the SRAM array.

In operation, if the pass-gate transistors PG-1 and PG-2 are inactive, the SRAM cell 50 will maintain the complementary values at storage nodes SN and SNB indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

During a WRITE operation, bit lines BL and BLB are set to opposite logic values according to the new data that will be written into the SRAM cell 50. For example, in an SRAM write operation, a logic state "1" stored in a data latch of the SRAM cell 50 can be reset by setting BL to "0" and BLB to "1". In response to a binary code from a row decoder (not shown), a word line coupled to the pass-gate transistors PG-1 and PG-2 of the SRAM cell 50 is asserted to select the memory cell and turn on PG-1 and PG-2. As a result, the storage nodes SN and SNB are connected to BL and BLB respectively. Furthermore, the storage node SN of the data latch is discharged by BL to "0" and the other storage node of the data latch is charged by BLB to "1". As a result, the new data logic "0" is latched into the SRAM cell 50.

In a READ operation, both BL and BLB of the SRAM cell 50 are pre-charged to a voltage approximately equal to the operating voltage of the memory bank in which the SRAM cell 50 is located. In response to a binary code from the row decoder, a word line coupled to the first pass-gate PG-1 and the second pass-gate PG-2 of the SRAM cell 50 is asserted so that the data latch is selected to proceed to a READ operation.

During a READ operation, through a turned on pass-gate transistors PG-1 and PG-2, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB (approximately in a range from 50 to 100 mV) is detected by a sense amplifier (not shown). Furthermore, the sense amplifier amplifies the differential voltage and reports the logic state of the memory cell via a data buffer.

In the circuit diagram of FIG. 15A, transistors PU-1, PU-2 are p-type transistors. Transistors PD-1, PD-2, PG-1, and PG-2 are n-type transistors. According to various embodiments, transistors PU-1, PU-2, PD-1, PD-2, PG-1 and PG-2 are implemented by planar FETs.

In some embodiments, each of the first pass-gate transistor PG-1 and the second pass-gate transistor PG-2 may be the same as one of the transistor devices 10a, 10b and 10c shown in FIGS. 10A-1OC. In some embodiments, each of the pull-down n-type metal oxide semiconductor (NMOS) transistor PD-1 and the pull-down NMOS transistor PD-2 may be the same as one of the transistor devices 10a, 10b and 10c in FIGS. 10A-10C. Details about the structures of the transistor devices 10a, 10b and 10c are discussed previously with respect to FIGS. 10A-10C and thus not repeated for the sake of brevity. In some embodiments, the pull-up p-type metal oxide semiconductor (PMOS) transistor PU-1 and the pull-up PMOS transistor PU-2 may be the same as the transistor devices 10e, 10f and 10g shown in FIGS. 11A-11C. Details about the structures of the transistor devices 10e, 10f and 10g are discussed previously with respect to FIGS. 11A-11C and thus not repeated for the sake of brevity.

Figure 16:
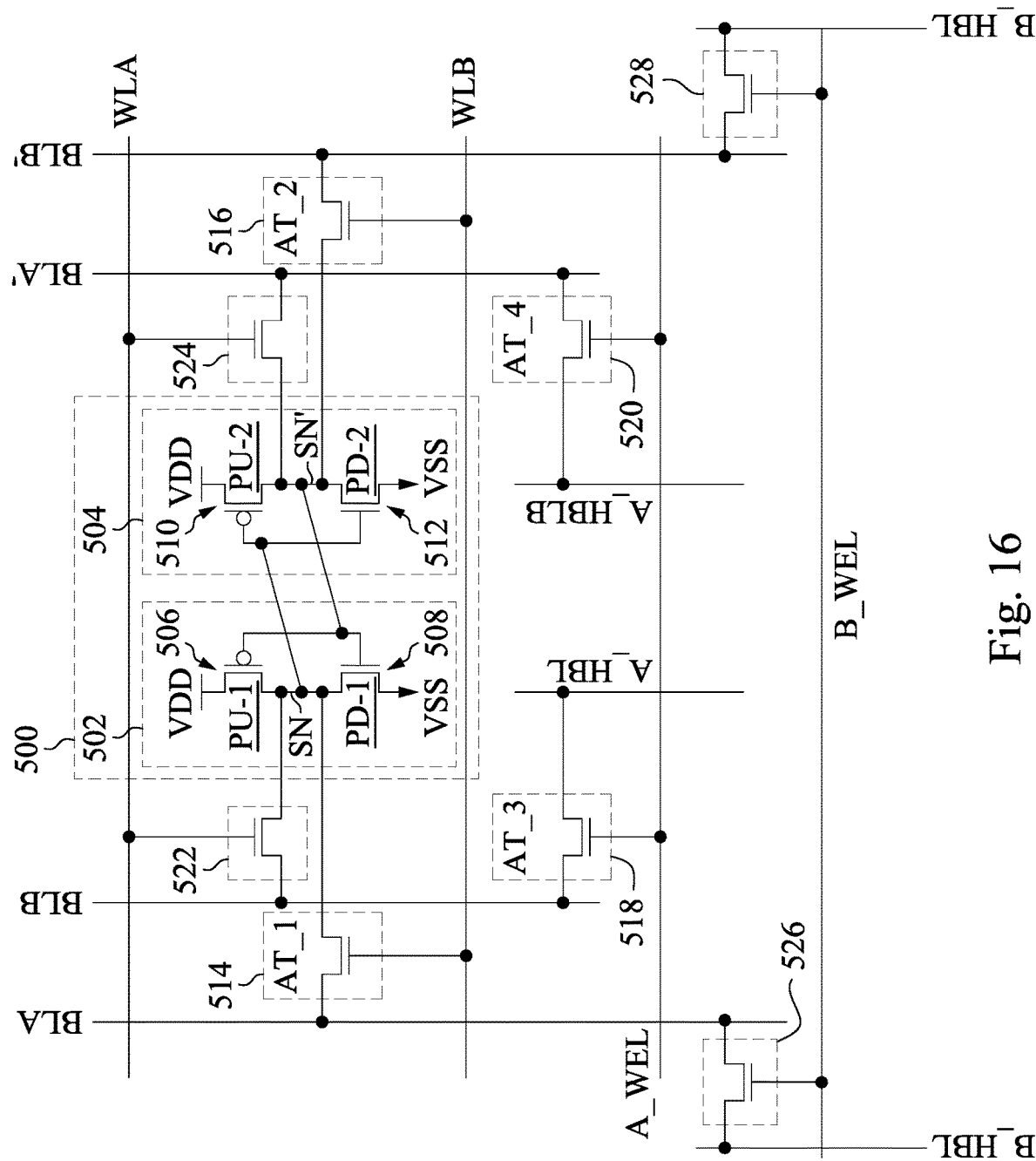
FIG. 16 is a circuit diagram of a dual port (DP) static random-access memory (SRAM) according to various embodiments.

FIG. 16 is a circuit diagram of a dual port (DP) static random-access memory (SRAM) cell 60 according to various embodiments. The DP SRAM cell allows parallel operation, such as 1R (read) 1W (write), or 2R (read) in one cycle, and therefore has higher band width than a single port SRAM cell. In one embodiment, the DP SRAM cell 60 includes planar field-effect transistors (FETs).

The DP SRAM cell 60 includes a data storage element 500 made up of a first inverter 502 and a second inverter 504, which are cross-coupled to establish first and second data storage nodes SN, SN'. The first inverter 502 includes a first pull-up transistor (PU-1) 506 and a first pull-down transistor (PD-1) 508. The second inverter 504 includes a second pull-up transistor (PU-2) 510 and a second pull-down transistor (PD-2) 512.

Several access transistors selectively couple the first and second data storage nodes SN, SN' to bitlines (BLA, BLA', BLB, BLB'), thereby allowing data to be selectively read from and written to the data storage element 500. In the DP SRAM cell 60, read and write operations can be made through two "ports", which are indicated by subscripts "A" and "B" (not shown). Each port has its own set of wordlines and its own set of bitlines, which are separate from those of the other port. For example, along the rows of the array, port A includes a wordline WLA, while port B includes a wordline WLB. With regards to port A, a first access transistor 514 is coupled to the first data storage node SN, and a second access transistor 516 is coupled to the second data storage node SN'. The first access transistor (AT-1) 514 has a first source/drain region coupled to the first data storage node SN', a first drain/source region coupled to a first bitline BLA, and a first gate region coupled to a first wordline WLA. The second access transistor (AT-2) 516 has a second source/drain region coupled to the second data storage node SN', a second drain/source region coupled to a second bitline BLA', and a second gate region coupled to the first wordline WLA. With regards to port B, a third access transistor (AT-3) 518 is coupled to the first data storage node SN, and a fourth access transistor 520 is coupled to the second data storage node SN'. The third access transistor (AT-3) 518 has a third source/drain region coupled to the first data storage node SN, a third drain/source region coupled to a third bitline BLB, and a third gate region coupled to a second wordline WLB. The fourth access transistor (AT-4) 520 has a fourth source/drain region coupled to the second data storage node SN', a fourth drain/source region coupled to a fourth bitline BLB', and a fourth gate region coupled to the second wordline WLB. The DP SRAM cell 60 further includes a first hit bit line HBL and a second hit bit line HBLB.

With regards to port A, a transistor 522 is coupled to first data storage node SN, and a second transistor 524 is coupled to the second data storage node SN'. The transistor 522 has a source/drain region coupled to the third bitline BLB, a drain/source region coupled to the hit bit line HBL, and a first gate region coupled to a fifth wordline WEL. The transistor 524 has a second source/drain region coupled to the second bitline BLA', a second drain/source region coupled to the second hit bit line HBLB, and a second gate region coupled to the fifth wordline WEL. With regards to port B, a transistor 526 is coupled to the first data storage node SN, and a transistor 528 is coupled to the second data storage node SN'. The transistor 524 has a source/drain region coupled to the first bit line BLA, a drain/source region coupled to the first hit bit line HBL, and a gate region coupled to a sixth wordline WEL. The transistor 528 has a source/drain region coupled to the fourth bitline BLB', a drain/source region coupled to the first hit bit line HBL, and a gate region coupled to the sixth wordline WEL.

In the present embodiment of the DP SRAM cell 60, the total number of the transistors in the cell is 12. In some other embodiment of the DP SRAM cell 60, the total number of the transistors in the cell may be greater than 12.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the double hump effect in the drain current caused by the effect of the one or more divots on the electric field generated by the subsequently formed gate structure is reduced. Another advantage is that the transistor device can be formed without an extra mask and thus enables low cost fabrication and the fabrication thereof is compatible to standard process. The transistor device has no side effect on its reliability and performance as well.

In some embodiments, an integrated chip includes a substrate, an isolation structure and a poly gate structure. The isolation structure includes one or more dielectric materials within the substrate and having sidewalls defining an active region in the substrate. The active region has a channel region, a source region, and a drain region separated from the source region by the channel region along a first direction. The source region has a first width along a second direction perpendicular to the first direction, the drain region has a second width along the second direction, and the channel region has a third width along the second direction and larger than the first width and the second width. The poly gate structure extends over the channel region. The poly gate structure includes a first doped region having a first type of dopants and a second doped region having a second type of dopants. The second type is different from the first type.

In some embodiments, an integrated chip includes a substrate, an isolation structure, a first poly gate structure and a second poly gate structure. The isolation structure includes one or more dielectric materials within the substrate and having first sidewalls defining a first active region in the substrate. The first active region has a first channel region, a first source region, and a first drain region separated from the first source region by the first channel region along a first direction. The first source region has a first width along a second direction perpendicular to the first direction. The first drain region has a second width along the second direction. The first channel region has a third width along the second direction and larger than the first width and the second width. The isolation structure has second sidewalls defining a second active region in the substrate. The second active region has a second channel region, a second source region, and a second drain region separated from the second source region by the second channel region along the first direction.

The first poly gate structure extends over the first channel region. The first poly gate structure includes a first doped region having a first type of dopants and a second doped region having a second type of dopants. The second type is different from the first type. The second poly gate structure extends over the second channel region. The second poly gate structure includes a third doped region having a third type of dopants and a fourth doped region having a fourth type of dopants. The fourth type is different from the third type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
    forming an isolation structure within a trench in a substrate, wherein the isolation structure defines a source region, a drain region, and a channel region arranged between the source region and the drain region along a first direction and extending past the source region and the drain region along a second direction perpendicular to the first direction;
    depositing a poly gate electrode in the channel region; and
    implanting two separated regions of the poly gate electrode to form two first doped regions having a first type of dopants.

2. The method of claim 1, further comprising:
    after implanting the two separated regions of the poly gate electrode, implanting a remaining region of the poly gate electrode having a second type of dopants.

3. The method of claim 2, wherein the first type is different from the second type.

4. The method of claim 1, wherein the two first doped regions are symmetric with respect to a center of the poly gate electrode.

5. A method of forming an integrated chip, comprising:
    forming an isolation structure within a trench in a substrate, wherein the isolation structure defines a source region, a drain region, and a channel region arranged between the source region and the drain region along a first direction and extending past the source region and the drain region along a second direction perpendicular to the first direction, and the isolation structure has one or more divots recessed below a top of the isolation structure;
    forming a gate electrode over the isolation structure and within the one or more divots; and
    performing a first doping process to the gate electrode to form a first doped region while second regions of the gate electrode are undoped during the first doping process, wherein the second regions are separated by a non-zero distance in the second direction.

6. The method of claim 5, wherein the first doped region passes opposing sides of the channel region.

7. The method of claim 5, further comprising:
    performing a second doping process to the second regions of the gate electrode to form second doped regions, wherein the second doped regions have a conductivity type different than the conductivity of the first doped region.

8. The method of claim 7, wherein the second doped regions extend across the one or more divots along the second direction.

9. The method of claim 7, wherein the second doped regions are set toward a boundary of the channel region extending along the second direction by a first distance along the first direction and set back from another boundary of the channel region extending along the second direction by a second distance different from the first distance along the first direction.

10. The method of claim 7, wherein the second doped regions each has a boundary overlapping a boundary of the channel region along the second direction.

11. The method of claim 7, wherein the second doped regions each has a dopant concentration in a range from about $1\times10^{13}$ cm$^{-2}$ to about $1\times10^{17}$ cm$^{-2}$.

12. The method of claim 7, wherein the second doped regions are enclosed by the first doped region.

13. A method of forming an integrated chip, comprising:
    forming an isolation structure within a trench in a substrate, wherein the isolation structure defines a source region, a drain region, and a channel region arranged between the source region and the drain region along a first direction and extending past the source region and the drain region along a second direction perpendicular to the first direction, and the isolation structure has one or more divots recessed below a top of the isolation structure;
    depositing a poly gate electrode in the channel region; and
    performing a first implantation process to implant first dopants into a first region of the poly gate electrode while second regions of the poly gate electrode are undoped during the first implantation process, wherein the second regions are separated by a non-zero distance in the second direction.

14. The method of claim 13, wherein one of the source region and the drain region has a width less than a width of the channel region.

15. The method of claim 13, wherein positions of the second regions are asymmetric with respect to the channel region.

16. The method of claim 13, wherein positions of the second regions are asymmetric with respect to a center of the first region.

17. The method of claim 13, wherein the second regions each has a recess recessed below a top of the second regions.

18. The method of claim 13, wherein the second regions are symmetric with respect to a center of the poly gate electrode.

19. The method of claim 13, further comprising:
    performing a second implantation process to implant second dopants into the second regions of the poly gate electrode after performing the first implantation process.

20. The method of claim 19, wherein the second dopants have a different conductivity type than the first dopants.

* * * * *